(12) United States Patent
Onodera et al.

(10) Patent No.: US 8,683,943 B2
(45) Date of Patent: Apr. 1, 2014

(54) PLASMA PROCESS APPARATUS AND PLASMA PROCESS METHOD

(75) Inventors: Naomi Onodera, Oshu (JP); Kiyohiko Gokon, Oshu (JP); Jun Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 781 days.

(21) Appl. No.: 12/768,799

(22) Filed: Apr. 28, 2010

(65) Prior Publication Data

US 2010/0278999 A1    Nov. 4, 2010

(30) Foreign Application Priority Data

May 1, 2009   (JP) .................................. 2009-112319
Feb. 24, 2010  (JP) .................................. 2010-039446

(51) Int. Cl.
*C23C 16/509*  (2006.01)
*C23C 16/505*  (2006.01)
*C23C 16/52*   (2006.01)
*H01L 21/306*  (2006.01)
*C23F 1/00*    (2006.01)
*C23C 16/06*   (2006.01)
*C23C 16/22*   (2006.01)

(52) U.S. Cl.
USPC ............. 118/723 E; 156/345.43; 156/345.44; 156/345.24; 156/345.27; 118/666

(58) Field of Classification Search
USPC ............ 118/723 E, 666; 156/345.43–345.44, 156/345.24, 345.27
See application file for complete search history.

(56) References Cited

U.S. PATENT DOCUMENTS

| 4,719,873 | A | * | 1/1988 | Fujiyama ................... 118/723 E |
| 4,858,557 | A | * | 8/1989 | Pozzetti et al. ............... 118/725 |
| 5,062,386 | A | * | 11/1991 | Christensen .................. 118/725 |
| 5,097,890 | A | * | 3/1992 | Nakao ........................... 165/206 |
| 5,128,515 | A | * | 7/1992 | Tanaka ........................... 219/390 |
| 5,160,545 | A | * | 11/1992 | Maloney et al. ............... 118/725 |
| 5,314,541 | A | * | 5/1994 | Saito et al. .................... 118/725 |
| 5,346,555 | A | * | 9/1994 | Nunotani et al. ............. 118/724 |
| 5,364,488 | A | * | 11/1994 | Minato et al. ............ 156/345.27 |
| 5,449,444 | A | * | 9/1995 | Yoshikawa ............... 204/192.12 |
| 5,622,566 | A | * | 4/1997 | Hosaka et al. .......... 118/723 VE |
| 5,647,912 | A | * | 7/1997 | Kaminishizono et al. ..... 118/719 |
| 5,647,945 | A | * | 7/1997 | Matsuse et al. .......... 156/345.38 |

(Continued)

FOREIGN PATENT DOCUMENTS

CN     101042992 A    9/2007
JP      63249331 A  * 10/1988

(Continued)

*Primary Examiner* — Rudy Zervigon
(74) *Attorney, Agent, or Firm* — IPUSA, PLLC

(57) ABSTRACT

A disclosed plasma process apparatus is disclosed that applies a plasma process to an object to be processed, including a cylindrical processing container configured to be evacuatable to vacuum, a holding unit configured to hold plural objects to be processed and inserted into and to be extracted from the cylindrical processing container, a gas supplying unit configured to supply a gas into the processing container, an activating unit configured to be located along a longitudinal direction of the processing container and to activate the gas by plasma generated by a high frequency power, a cylindrical shield cover configured to surround a periphery of the processing container and to be connected to ground for shielding from high frequency, and a cooling device configured to cause the cooling gas to flow through a space between the cylindrical shield cover and the cylindrical processing container during the plasma process.

17 Claims, 16 Drawing Sheets

(56) References Cited

U.S. PATENT DOCUMENTS

| | | | |
|---|---|---|---|
| 5,681,418 A * | 10/1997 | Ishimaru | 156/345.37 |
| 5,709,757 A * | 1/1998 | Hatano et al. | 134/22.14 |
| 5,804,923 A * | 9/1998 | Iio et al. | 315/111.21 |
| 5,902,406 A * | 5/1999 | Uchiyama et al. | 118/724 |
| 5,911,852 A * | 6/1999 | Katayama et al. | 156/345.41 |
| 5,951,772 A * | 9/1999 | Matsuse et al. | 118/723 R |
| 6,015,465 A * | 1/2000 | Kholodenko et al. | 118/719 |
| 6,113,732 A * | 9/2000 | Yoshida et al. | 156/345.37 |
| 6,143,129 A * | 11/2000 | Savas et al. | 156/345.48 |
| 6,273,955 B1 * | 8/2001 | Yoshino et al. | 118/718 |
| 6,326,597 B1 * | 12/2001 | Lubomirsky et al. | 219/494 |
| 6,367,410 B1 * | 4/2002 | Leahey et al. | 118/723 I |
| 6,598,559 B1 * | 7/2003 | Vellore et al. | 118/723 VE |
| 6,738,683 B1 * | 5/2004 | Dunn | 700/121 |
| 6,835,919 B2 * | 12/2004 | Tolmachev et al. | 219/494 |
| 6,863,019 B2 * | 3/2005 | Shamouilian et al. | 118/723 R |
| 6,879,778 B2 * | 4/2005 | Yoo et al. | 392/416 |
| 7,771,535 B2 * | 8/2010 | Koyanagi | 118/715 |
| 7,900,580 B2 * | 3/2011 | Kontani et al. | 118/723 E |
| 7,993,457 B1 * | 8/2011 | Krotov et al. | 118/719 |
| 8,002,895 B2 * | 8/2011 | Inoue et al. | 118/715 |
| 8,261,692 B2 * | 9/2012 | Kontani et al. | 118/723 E |
| 8,267,041 B2 * | 9/2012 | Abe et al. | 118/723 E |
| 8,394,200 B2 * | 3/2013 | Matsuura et al. | 118/715 |
| 2001/0021486 A1 * | 9/2001 | Kitano | 430/322 |
| 2003/0164143 A1 * | 9/2003 | Toyoda et al. | 118/723 E |
| 2004/0121086 A1 * | 6/2004 | Takagi et al. | 427/573 |
| 2005/0145341 A1 * | 7/2005 | Suzuki | 156/345.49 |
| 2005/0211264 A1 * | 9/2005 | Kostenko et al. | 134/1.1 |
| 2005/0255712 A1 * | 11/2005 | Kato et al. | 438/791 |
| 2005/0287775 A1 * | 12/2005 | Hasebe et al. | 438/503 |
| 2006/0118043 A1 * | 6/2006 | Wagner et al. | 118/723 E |
| 2006/0260544 A1 * | 11/2006 | Toyoda et al. | 118/715 |
| 2007/0240644 A1 | 10/2007 | Matsuura et al. | |
| 2008/0093024 A1 * | 4/2008 | Abe et al. | 156/345.44 |
| 2008/0251015 A1 * | 10/2008 | Kontani et al. | 118/715 |
| 2008/0286980 A1 * | 11/2008 | Ishimaru | 438/716 |
| 2009/0071405 A1 * | 3/2009 | Miyashita et al. | 118/723 R |

FOREIGN PATENT DOCUMENTS

| | | | |
|---|---|---|---|
| JP | 09115693 A * | 5/1997 | |
| JP | 09298162 A * | 11/1997 | |
| JP | 2005-197523 A | 7/2005 | |
| JP | 2006-049809 | 2/2006 | |
| JP | 2006-270016 | 10/2006 | |
| JP | 2007-42823 | 2/2007 | |
| WO | WO 2006/093136 | 9/2006 | |

* cited by examiner

FIG.7A

| ⟨CONVENTIONAL APPARATUS CORRESPONDING TO FIG.6A⟩ | | | | |
|---|---|---|---|---|
| CONTINUOUS RUN 1 TO 7 | TOP | T-C | C-B | BTM |
| Max [°C] | 46.5 | 44.8 | 42.8 | 40.1 |
| Min [°C] | 28.0 | 28.3 | 29.2 | 29.4 |
| Δ [°C] | 18.5 | 16.5 | 13.6 | 10.7 |

FIG.7B

| ⟨EMBODIMENT VOLUMETRIC FLOW RATE : 0.35 m³/min⟩ | | | | |
|---|---|---|---|---|
| CONTINUOUS RUN 1 TO 7 | TOP | T-C | C-B | BTM |
| Max [°C] | 32.5 | 31.1 | 29.9 | 28.6 |
| Min [°C] | 27.3 | 27.2 | 27.7 | 27.2 |
| Δ [°C] | 5.2 | 3.9 | 2.2 | 1.4 |

FIG. 7C

| ⟨EMBODIMENT CORRESPONDING TO FIG.6B VOLUMETRIC FLOW RATE : 0.55 m³/min⟩ | | | | |
|---|---|---|---|---|
| CONTINUOUS RUN 1 TO 7 | TOP | T-C | C-B | BTM |
| Max [°C] | 30.1 | 28.5 | 28.8 | 28.3 |
| Min [°C] | 26.5 | 26.6 | 27.4 | 27.1 |
| Δ [°C] | 3.6 | 1.9 | 1.4 | 1.2 |

FIG. 7D

| ⟨EMBODIMENT VOLUMETRIC FLOW RATE : 0.72 m³/min⟩ | | | | |
|---|---|---|---|---|
| CONTINUOUS RUN 1 TO 7 | TOP | T-C | C-B | BTM |
| Max [°C] | 29.0 | 27.7 | 28.2 | 27.7 |
| Min [°C] | 26.0 | 26.0 | 26.7 | 26.5 |
| Δ [°C] | 3.0 | 1.7 | 1.5 | 1.2 |

PLASMA PROCESS APPARATUS AND PLASMA PROCESS METHOD

CROSS-REFERENCE TO RELATED APPLICATIONS

This patent application is based upon and claims the benefit of priority of Japanese Patent Application No. 2009-112319 filed on May 1, 2009 and Japanese Patent Application No. 2010-039446 filed on Feb. 24, 2010, the entire contents of which are incorporated herein by reference.

BACKGROUND OF THE INVENTION

1. Field of the Invention

The present invention relates to a plasma process apparatus and a plasma process method for providing a film forming process at a temperature range of about room temperature using plasma with an object to be processed such as a semiconductor wafer.

2. Description of the Related Art

Ordinarily, when semiconductor integrated circuits are manufactured, semiconductor wafers undergo various processes such as a film forming process, an etching process, an oxidizing process, a diffusing process, a reforming process and a removing process of natural oxidation.

In recent years, it is required to process film forming materials at a low temperature in consideration of heat resistance or the like thereof. In order to deal with this requirement, there are proposed plasma process apparatuses using plasma with which reaction can be promoted even though a wafer temperature at a time of processing is low (Patent Documents 1 to 4).

An example of the plasma processing apparatuses is illustrated in FIG. 14. FIG. 14 is a schematic view of an example of conventional lateral-type plasma process apparatus. Referring to FIG. 14, semiconductor wafers W are held by a rotatable and multiple-stage wafer boat 4. The wafer boat 4 may be inserted or extracted into or from the processing container 2 by being moved up and down from a lower side of the processing container 2. Further, a lower end of the processing container 2 may be hermetically sealed by a lid 6. A plasma generating box 8 having a rectangular cross-sectional shape is provided in a sidewall of the processing container 2 along the height of the sidewall.

On both outer sides of the compartment walls of the plasma generating box 8, a pair of independent plasma electrodes 12 facing each other are provided along the height of the plasma generating box 8. A high frequency power of, for example 13.56 MHz, is supplied from a high frequency power source 14 for generating plasma to a region between the plasma electrodes 12. Further, an insulating material 16 is provided on the outer side of the processing container 2 including the outer side of a ceiling portion. Further, a heater 18 for heating the semiconductor wafer W is provided on the inner side surface of the inner side surface of the insulating material 16. A shield cover is provided on the outer side surfaces of the insulating material 16, and connected to ground to thereby prevent the high frequency from leaking outside.

In such a structure, when the high frequency power is supplied to the region between the plasma electrodes 12, plasma is generated. The gas supplied into the plasma generating box 8 is activated by the plasma to thereby generate active species. In this way, a reaction or the like is promoted by the generated active species even though the heating temperature is low.

[Patent Document 1] Japanese Unexamined Patent Publication No. 2006-049809
[Patent Document 2] Japanese Unexamined Patent Publication No. 2006-270016
[Patent Document 3] Japanese Unexamined Patent Publication No. 2007-42823
[Patent Document 4] International Publication Pamphlet No. WO 2006/093136

In recent years, there is proposed a new technology called micro electro mechanical systems (MEMS) as assembling using a microfabrication technique. According to MEMS, a three-dimensional device such as a pressure sensor or a microphone may be installed in a small chip. One example of MEMS enables assembling a micromotor having a rotor. For example, when the micromotor is formed, a rotatable microscopic rotor should be formed. Therefore, a microscopic part corresponding to the rotor is previously formed to wrap an entire periphery of the microscopic with an oxide film. Then, a casing for accommodating the rotor is formed by a thin film. Thereafter, the entire oxide film is removed by etching it to thereby make an inside of the casing hollow. Thus, the microscopic rotor is furnished to have a structure in which the microscopic rotor is spontaneously rotatable inside the casing.

The thin film which is necessarily formed in mid-flow of the manufacturing process and removed later is referred to as a sacrificial layer which does not remain in the device. In a case of an oxide film, it is referred to as a sacrificial oxide layer. Film properties of the sacrificial layer and the sacrificial oxide layer are not a problem as long as the sacrificial layer and the sacrificial oxide layer are removed later. Therefore, when an oxide film or the like which is required to have good film properties such as ordinary gate oxide films and ordinary inter-layer insulating films, it is necessary to conduct a forming process under a relatively high temperature in order to acquire good film properties. Meanwhile, there is now being developed a technique of forming the sacrificial oxide layer under a low temperature region in order to form such the sacrificial oxide layer.

In order to form the sacrificial oxide layer, a plasma process apparatus as described with reference to FIG. 14 is used as a film forming apparatus. An aminosilane-based gas such as diisopropylaminosilane (DIPAS) and an active species such as ozone generated by plasma are used, and the sacrificial oxide layer is formed at a relatively low temperature of about room temperature.

However, when the plasma process apparatus as described with reference to FIG. 14 is used in order to form the sacrificial oxide layer, heat generated by plasma is accumulated in a space between the processing container 2 and the insulating material 16 at every batch process. As a result, when the batch processes are continuously conducted, there is a problem that a process temperature gradually increases at every batch process to thereby decrease reproducibility of forming the film.

SUMMARY OF THE INVENTION

Accordingly, embodiments of the present invention may provide a novel and useful plasma process apparatus and plasma process method solving one or more of the problems discussed above.

More specifically, the embodiments of the present invention may provide a plasma process apparatus that can improve reproducibility of a plasma process such as a film forming process by maintaining a low process temperature when the plasma process is carried out under a process temperature in a low temperature range of about room temperature.

Further, the embodiments of the present invention may provide a plasma process apparatus and a plasma process method which can improve a throughput by reducing a frequency of cleaning.

According to an aspect of the present invention, there is provided a plasma process apparatus that applies a plasma process to an object to be processed, the plasma process apparatus including a cylindrical processing container configured to be evacuatable to vacuum, a holding unit configured to hold plural objects to be processed and to be inserted into and extracted from the cylindrical processing container, a gas supplying unit configured to supply a gas into the processing container, an activating unit configured to be located along a longitudinal direction of the processing container and to activate the gas by plasma generated by a high frequency power, a cylindrical shield cover configured to surround a periphery of the processing container and to be connected to ground for shielding from high frequency, and a cooling device configured to cause the cooling gas to flow through a space between the cylindrical shield cover and the cylindrical processing container during the plasma process.

As described, in the plasma process apparatus, the plural objects to be processed held by the holding unit are accommodated in the cylindrical processing container and a necessary gas is introduced into the processing container, an active species of the gas is generated by the plasma generated by the activating unit, and the objects to be processed undergo a plasma process using the active species. The plasma process apparatus includes the cylindrical shield cover formed to surround the periphery of the processing container to shield from high frequency, and the cooling device which causes the cooling gas to flow through the space between the shield cover and the processing container during the plasma process. The cooling gas flows along the outer side of the processing container with the cooling device to cool the processing container during the plasma process. Therefore, heat generated by the plasma does not accumulate in the space between the shield cover and the processing container. As a result, when the plasma process is carried out at a low temperature range of about room temperature, the process temperature can be maintained low enough to improve reproducibility of the plasma process such as the film forming process.

According to another aspect of the present invention, there is provided the plasma process apparatus further including a thermometry unit for measuring a temperature of the atmosphere in the space, an exhaust tube connected between the exhaust header and the exhaust source, and a valve device which is installed in mid-course of the exhaust tube, and closes during the plasma process in a case where the measured temperature obtained by the thermometry unit when the plasma process apparatus is in a stand-by state is lower than a preset threshold temperature when the atmosphere in the space is evacuated at a preset volumetric flow rate.

As described, there includes the thermometry unit for measuring the temperature of the atmosphere in the space, the exhaust tube provided between the exhaust header and the exhaust source, the valve device which is installed in mid-course of the exhaust tube, and closes during the plasma process in a case where the measured temperature obtained by the thermometry unit when the atmosphere in the space is evacuated with the preset volumetric flow rate is lower than the preset threshold temperature. Thus, it is possible to set the condition in which the unnecessary film depositing on the inner wall of the processing container hardly peels off, for example. As a result, the frequency of cleaning may be reduced to improve throughput.

According to another aspect of the present invention, there is provided a plasma process method of processing an object to be processed by a plasma process while enabling cooling of an inside of a plasma apparatus by taking in and exhausting a gas to evacuate an atmosphere of the inside including measuring a temperature of the atmosphere of the inside of the plasma process apparatus while the plasma is not generated, and stopping to take the gas into the inside of the plasma process apparatus during the plasma process in a case where the measured temperature is lower than a first preset threshold temperature when the atmosphere is evacuated at a preset volumetric flow rate.

Thus, it is possible to set the condition in which the unnecessary film depositing on the inner wall of the processing container hardly peels off, for example. As a result, the frequency of cleaning may be reduced to improve throughput.

Additional objects and advantages of the embodiments are set forth in part in the description which follows, and in part will become obvious from the description, or may be learned by practice of the invention. The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 7A, FIG. 7B, FIG. 7C and FIG. 7D illustrate temperature changes in the space obtained from FIG. 6A and FIG. 6B.

DETAILED DESCRIPTION OF THE PREFERRED EMBODIMENTS

A description is given below, with reference to the FIG. 1 through FIG. 13 of embodiments of the present invention.

Hereinafter, the following reference symbols typically designate as follows:
22: plasma process apparatus;
24: processing container;
28: wafer boat (holding unit);
46: first gas supplying unit;
48: second gas supplying unit;
58: activating unit;
62: plasma generating box;
64: plasma electrode;
66: high frequency power source;
72: shield cover;
74: cooling device;
76: intake header;
78: exhaust header;
80: exhaust source;
82: space;
83: duct of factory;
86: gas duct;
88: gas flow hole gas flow hole;
90: gas intake hole;
92: cooling gas guiding duct;
98: end plate;
100: gas flow hole;
102: exhaust box;
104: gas exhaust opening;
106: exhaust tube;
130: valve device;
132: flow rate control valve (pressure control valve);
134: first on-off valve;
136: gas supply tube;
138: second on-off valve;
140: thermometry unit;
140A, 140B, 140C, 140D: thermocouple; and
W: semiconductor wafer (object to be processed).

Figure 1:
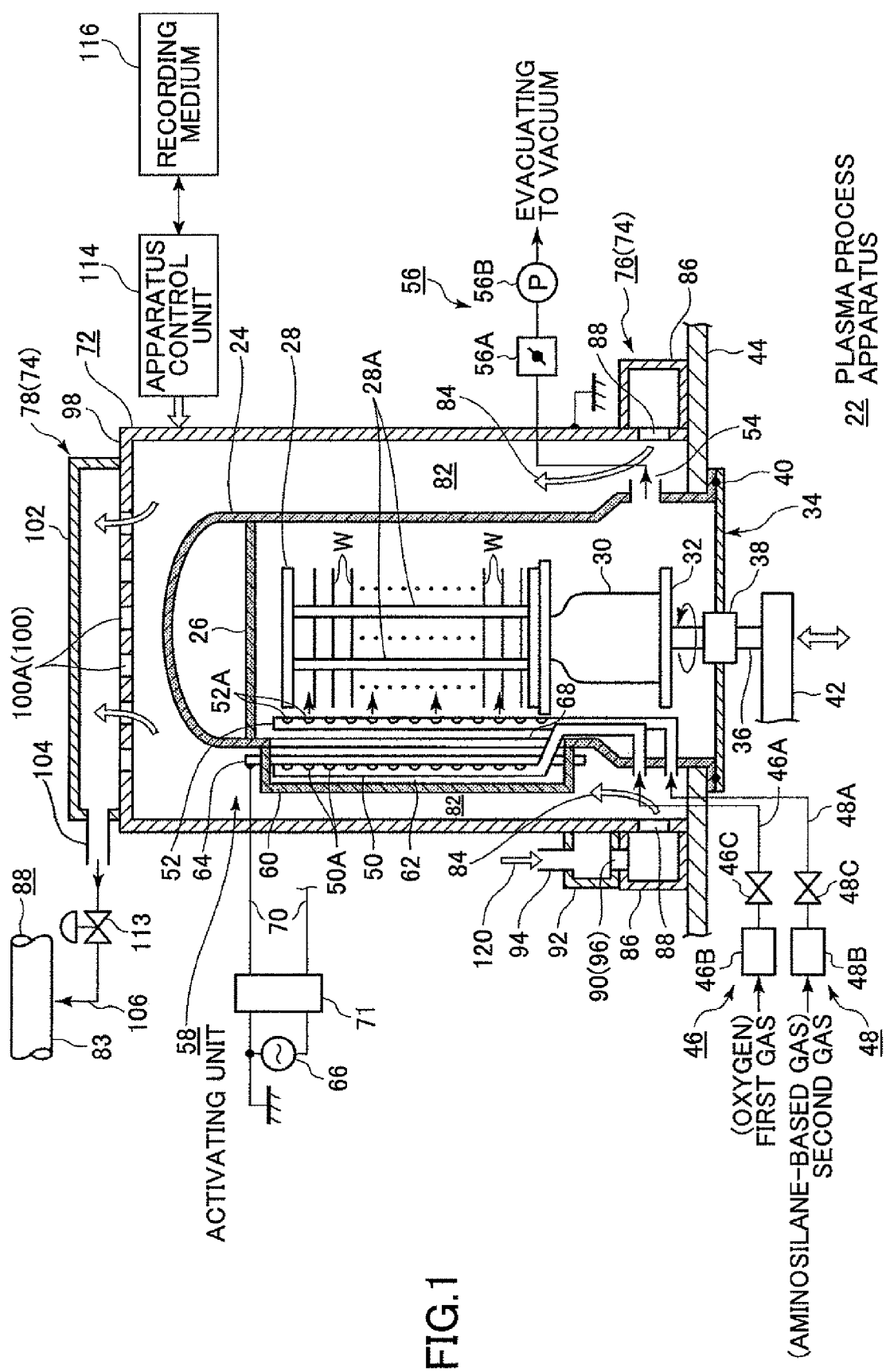
FIG. 1 is an example of a longitudinal cross-sectional view of a plasma process apparatus according to the present invention.
Figure 2:
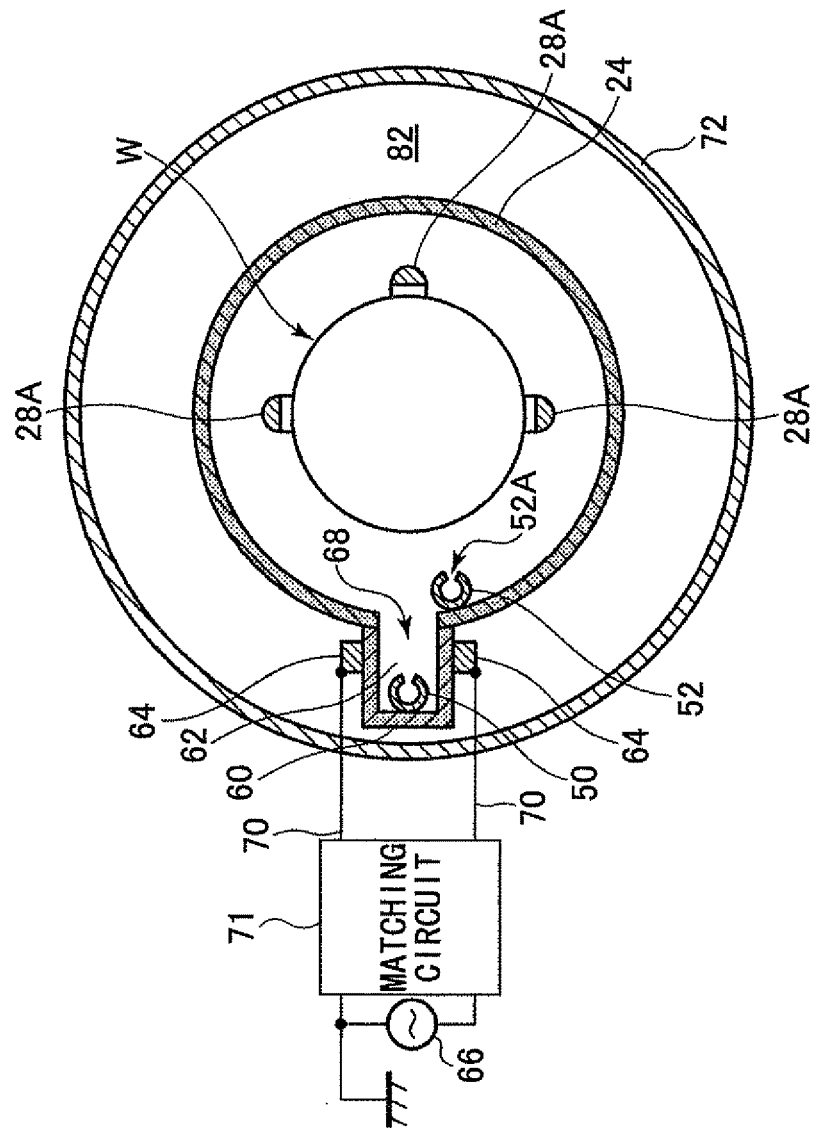
FIG. 2 is a lateral cross-sectional view of the plasma process apparatus.
Figure 3:
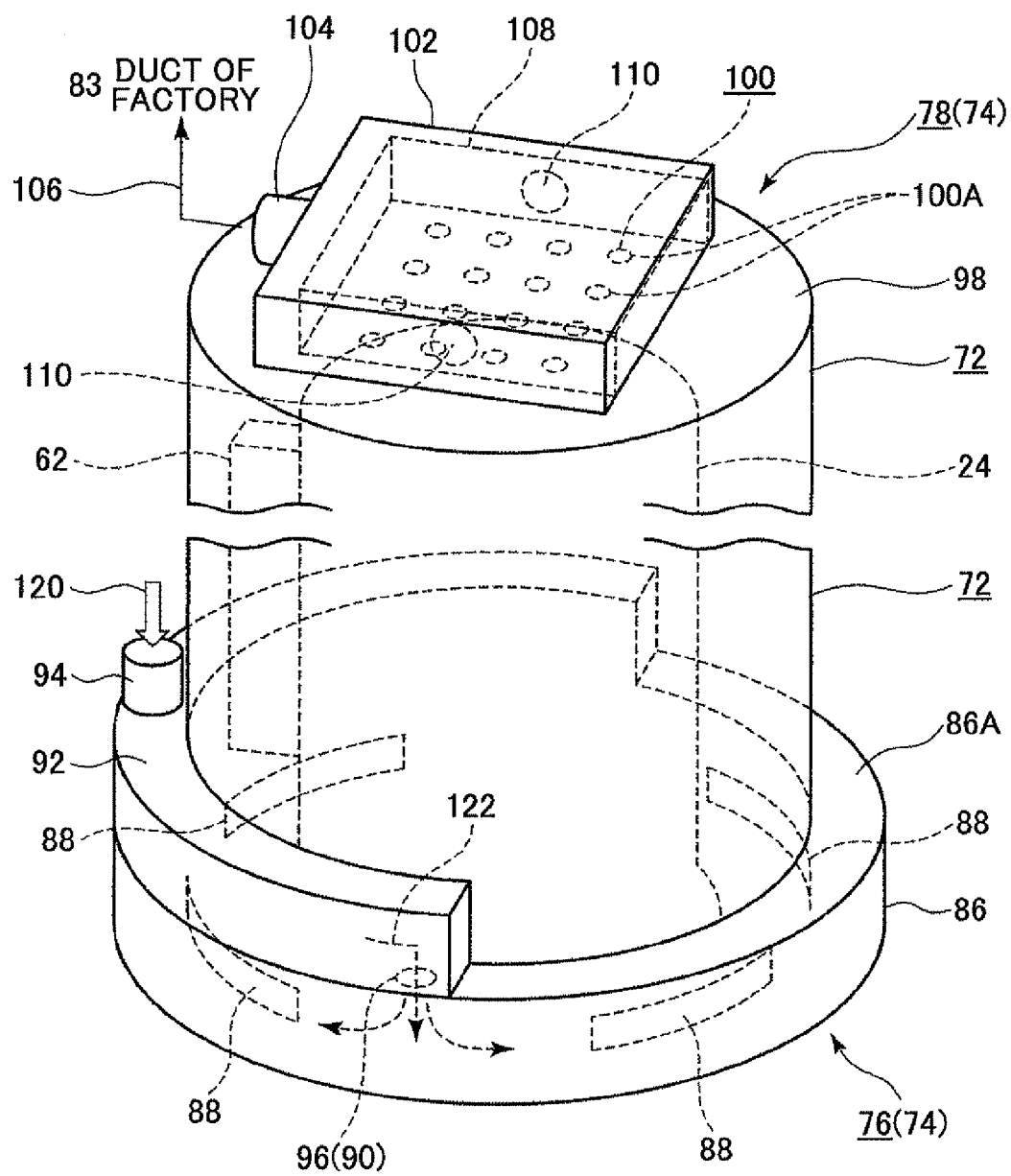
FIG. 3 is a schematic perspective view of a shield cover and a cooling device partly omitted.
Figure 4A:
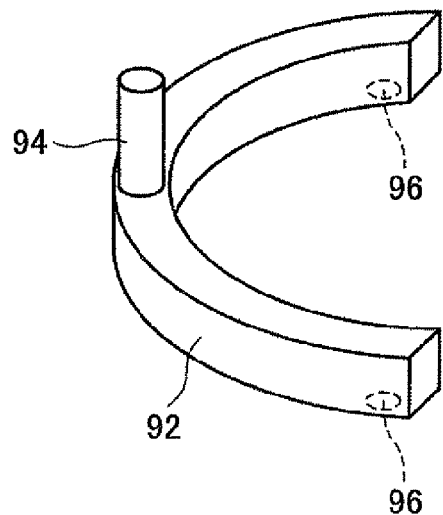
FIG. 4A and FIG. 4B are exploded perspective views of an intake header.
Figure 4B:
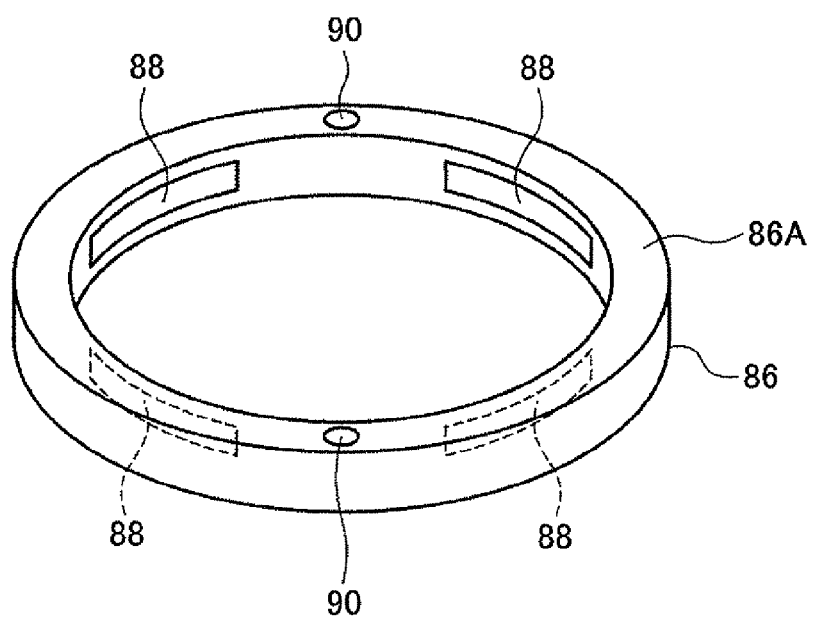
Figure 5:
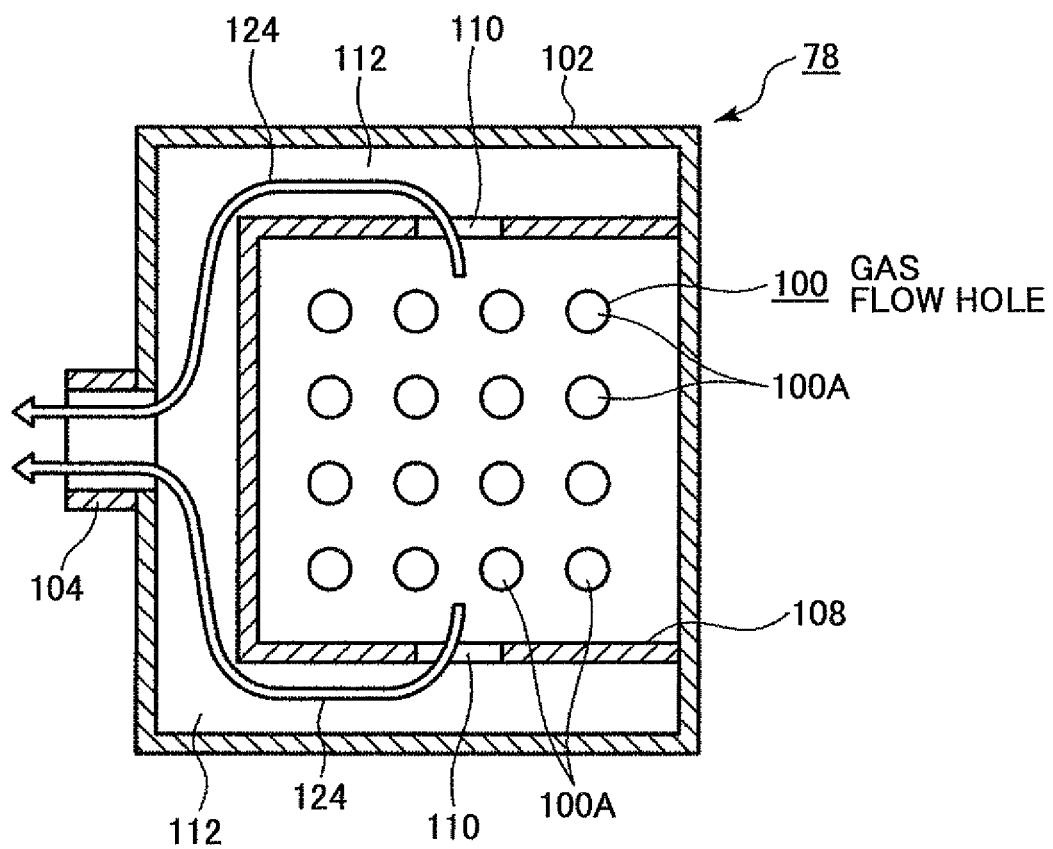
FIG. 5 is a lateral cross-sectional view of an exhaust header.

FIG. 1 is an example of a longitudinal cross-sectional view of a plasma process apparatus according to the present invention. FIG. 2 is a lateral cross-sectional view of the plasma process apparatus. FIG. 3 is a schematic perspective view of a shield cover and a cooling device partly omitted. FIG. 4A and FIG. 4B are exploded perspective views of an intake header. FIG. 5 is a lateral cross-sectional view of an exhaust header. As illustrated in FIG. 1 and FIG. 2, the plasma process apparatus 22 of the present invention includes a processing container 24 that has a ceiling and an opening at a lower end thereof and vertically extends in a longitudinal cylindrical shape. The entire processing container 24 is made of, for example, quartz. A ceiling plate 26 is installed in the ceiling inside the processing container 24. The ceiling plate 26 seals the ceiling 24. The lower end of the processing container 24 is set to have an inner diameter to improve exhaust properties. The lower end portion has the opening. It is possible to connect a cylindrical manifold made of, for example, stainless steel to the lower end.

A wafer boat 28, which is made of quartz and mounts semiconductor wafers W as objects to be processed in a multistage arrangement, may move up and down and be inserted into and ejected from the lower end opening. In the embodiment, the wafers W having a diameter of 300 mm and as many as 50 thru 150 pieces may be supported by columns 28A of the wafer boat 28 in the multistage arrangement, for example.

The wafer boat 28 is mounted on a table 32 via a heat-retention cylinder 30 made of quartz. The table 32 is Supported on a rotational shaft 36 which penetrates a lid 34 made of, for example, stainless steel and opening and closing the lower end opening. In a portion of the lid 34 where the rotational shaft 36 penetrates, a magnetic fluid seal 38 is installed, for example. The rotational shaft 36 is hermetically sealed and supported to be rotatable by the magnetic fluid seal 38. A sealing member 40 such as an O-ring is installed in a peripheral portion of the lid 34 and the lower end of the processing container 24 to seal the processing container 24 from the outside.

The above rotational shaft 36 is attached to an end of an arm 42, which is supported by an elevating mechanism (not illustrated) such as a boat elevator. The elevating mechanism integrally moves the wafer boat 28, the lid 34 or the like up and down to insert the wafer boat 28 into or extract the wafer boat 28 from the processing container 24. Meanwhile, the table may be fixed to the lid 34 to enable processing of the wafer W without rotating the wafer boat 28. The lower end of the processing container 24 may be attached to and supported by the base plate 44, made of, for example, stainless steel.

The lower portion of the processing container 24 has a first gas supplying unit 46 for supplying a first gas to be plasma and a second gas supplying unit 48 for supplying a second gas. Specifically, the first gas supplying unit 46 has a first gas nozzle 50 made of a quartz tube which inwardly penetrates a lower sidewall of the processing container 24, and upwardly bends and extends. The first gas nozzle 50 is of a diffusion type which has plural (many) gas ejection holes 50A formed with preset intervals in a longitudinal direction of the first gas nozzle 50. The first gas may be substantially evenly sprayed in the horizontal direction from the gas ejection holes 50A.

In a manner similar thereto, the second gas supplying unit 48 has a second gas nozzle 52 made of a quartz tube which inwardly penetrates the lower sidewall of the processing container 24, and upwardly bends and extends. The second gas nozzle 52 is of a diffusion type which has gas plural (many) ejection holes 52A formed with preset intervals in a longitudinal direction of the second gas nozzle 52. The second gas may be substantially evenly sprayed in the horizontal direction from the gas ejection holes 52A. In mid-flow of gas passageways 46A, 48A, flow controlling units 46B, 48B like a mass flow controller for controlling gas flow rates, and on-off valves 46C, 48C are installed.

Although only the first gas supplying unit 46 for supplying the first gas and the second gas supplying unit 48 for supplying the second gas are described, when more types of the gas are used, it is of course possible to further provide other gas supplying units corresponding to the types of the gas. For example, a gas supplying unit for supplying a purge gas such as $N_2$ may be provided. Although not illustrated, a cleaning gas supplying system for supplying a cleaning gas such as an HF system gas for removing unnecessary films is also provided.

An exhaust port 54 is formed on the lower sidewall of the processing container 24. A discharging system 56 having a pressure control valve 56A and a vacuum pump 56B is connected to the exhaust port 54. The discharging system 56 evacuates the atmosphere inside the processing container 24 to vacuum thereby maintaining the atmosphere to be a preset pressure.

An activating unit 58 for activating the first gas with the plasma generated by a high frequency power is formed in the processing container 24 along a longitudinal direction of the processing container 24. Referring to FIG. 2, the activating unit 58 is mainly formed by a plasma generating box 62 which is subdivided by a plasma compartment wall 60 provided along a longitudinal direction of the processing container 24, plasma electrodes 64 provided along the longitudinal direction of the plasma compartment wall, and a high frequency power source 66 connected to the plasma electrodes 64.

Specifically, the plasma generating box 62 is processed to have a long and thin opening 68 by scraping a preset width of the sidewall of the processing container 24 in up and down directions. The opening 68 on an outer wall of the processing container 24 is surrounded by the plasma compartment wall 60, which has a long and thin shape, has a cross-sectional U-like shape, extends in the up and down directions, and is made of quartz. The plasma compartment wall 60 is hermetically welded to the outer wall of the processing container 24.

In this way, the plasma generating box 62 which has a recess in the cross-sectional U-shape to inwardly open toward the processing container 24 and to outwardly protrude toward the outside of the sidewall of the processing container 24 is integrally formed. Said differently, the inner space of the plasma compartment wall 60 is a plasma generating region. The plasma generating region is integral with the inside of the processing container 24. The opening 68 is formed to be substantially long in the up and down directions to cover all the wafers W held by the wafer boat 28 in the height direction of the process container 24. The pair of the plasma electrodes 64 facing each other are formed on the outer side surfaces of the plasma compartment wall 60. The plasma electrodes 64 are formed along the entire longitudinal direction of the plasma generating box 62.

The plasma electrodes 64 are connected to a feed line 70. The feed line 70 is connected to a high frequency power source 66 interposing a matching circuit 71 for matching impedances. Plasma is generated in the plasma generating box 62 by the high frequency power. For example, the frequency of the high frequency power source 66 is 13.56 MHz. However, the frequency is not limited thereto, and frequencies may be in a range of 4 MHz thru 27.12 MHz.

The first gas nozzle 50 upwardly extending inside the processing container 24 is outwardly bent in mid-course along the radius of the processing container 24. Thus, the first gas nozzle 50 is positioned at the bottom inside the plasma generating box 62 and the portion most apart from the center of the processing container 24). Said differently, the first gas nozzle 50 upwardly stands along the bottom inside the plasma generating box 62. Therefore, the first gas injected from the gas ejection holes 50A of the first gas nozzle 50 when the high frequency power source 66 is turned on is activated by plasma in the plasma generating box 62, and diffuses and flows toward the center of the processing container 24. The first gas nozzle 50 may not penetrate the sidewall of the processing container 24, and may directly penetrate the lower end of the plasma compartment wall.

Referring to FIG. 2, the second gas nozzle 52 stands on an inner side of the opening 68. The second gas is injected toward the center of the processing container 24 from the gas ejection holes 52A formed in the second gas nozzle 52. A shield cover 72, being one of the features of the present invention, is provided on an outside of the processing container 24. A cooling device 74 for cooling a cooling gas during a plasma process is provided inside the shield cover 72. Specifically, a shield cover 72 is formed in, for example, a cylindrical shape and surrounds an entire periphery of the processing container 24 and the ceiling portion. The shield cover 72 made of a metal such as aluminum and stainless steel. The shield cover 72 is connected to ground to prevent high frequency from leaking from the activating unit 64 to the outside.

The lower end of the shield cover 72 is connected to the base plate 44 to prevent the high frequency from downward leaking from the shield cover 72. It is preferable to set a shield value (specific conductivity×relative magnetic permeability× thickness) of the shield cover as high as possible. For example, when SUS 304 (type of stainless steel) is used, it is preferable to set the thickness of the shield cover 72 to 1.5 mm or more. The size of the shield cover 72 may be about 600 mm when the diameter of the processing container 24 accommodating a wafer W having a diameter of 300 mm is 450 mm, for example.

The cooling device 74 attached to the shield cover 72 includes an intake header 76 provided in the lower end of the shield cover 72 for taking a cooling gas into the shield cover 72, and an exhaust header 78 provided in an upper end, i.e. the other end of the lower end, of the shield cover 72 for exhausting atmosphere inside the shield cover 72. The cooling gas flows along a space 82 between the shield cover 72 and the processing container 24. The exhaust header 78 is connected to an exhaust source 80. The exhaust source 80 includes a duct 83 provided in a factory to exhaust from various apparatuses including the plasma process apparatus 22 which are installed in a clean room. A large fan (not illustrated) is provided on a downstream side of the duct 83 to exhaust from the entire factory.

Referring to FIG. 3, FIG. 4A and FIG. 4B, the exhaust header 78 includes a gas duct 86 provided on a sidewall of the shield cover 72 along a peripheral direction of the shield cover 72, a gas flow hole formed in the sidewall of the shield cover 72 along the peripheral direction at preset intervals, and a gas intake hole 90 provided in the gas duct 86 for taking the cooling gas into the shield cover 72. The gas duct 86 has a substantially rectangular shape in section, and surrounds the periphery of the lower end of the shield cover 72 in a ring-like shape.

A pair of gas intake holes 90 (two gas holes) are formed in a ceiling portion 86A of the gas duct 86 to face along a diameter of the shield cover 72. The gas flow holes 88, as many as four, have a substantially rectangular shape respectively, and are arranged at even intervals along the peripheral direction of the shield cover 72. Therefore, the cooling gas taken in the gas duct 86 from the two gas intake holes 90 flows inside the gas duct 86. Then, the cooling gas further flows into the shield cover 72 from the gas flow holes 88 formed by punching metal in a ring-like shape.

It is preferable to form the gas intake holes 90 in central portions between the gas flow holes 88 adjacent each other. The number of the gas flow holes 88 is not limited to four, and may be two or more. The gas flow holes 88 may be formed like a ring or punching metal. Further, it is possible to attach punching metal in the gas flow hole 88 to enhance a shield effect against high frequency.

A cooling gas guiding duct 92 in a semicircular arc shape is provided to connect the two gas intake holes 90. A gas inlet 94 is formed in a center portion of the cooling gas guiding duct 92. Connection holes 96 connected to the gas intake holes 90 are formed on both sides of the gas inlet 94. Clean air, constantly maintained to be about 23° C. thru 27° C. in the clean room, is used as the cooling gas. Therefore, the cooling gas of the clean air introduced from the gas intake holes 90 flows into the cooling gas guiding duct 92, flows through the connection holes 96 and the gas intake holes 90, is separated in two directions inside the gas duct 86 in the ring-like shape, and flows into the shield cover 72. Specifically, a gas supply tube (not illustrated) is connected to the gas inlet 94. The clean air similar to that in the clean room is introduced into the gas inlet 94.

It is possible to directly take the clean air inside the clean room from the two gas intake holes 90 without providing the cooling gas guiding duct 92. It is possible to further increase the number of the gas intake holes 90.

On the other hand, referring to FIG. 3 and FIG. 5, the exhaust header 78 provided on the upper end of the shield cover 72 includes gas flow holes 100 formed in an end plate 98 clogging the end face of the shield cover 72, an exhaust box 102 formed in a box like shape to surround the gas flow holes 100, a gas exhaust opening 104 provided in the exhaust box 102, and an exhaust tube 106 connected to the gas exhaust opening 104 and the duct 83 of the factory (see FIG. 1) as the exhaust source.

The end plate 98 functions as a ceiling plate of the shield cover 72. The end plate 98 is made of, for example, stainless steel having a shield function of shielding against high frequency. The gas flow holes 100 are formed in the end plate 98 by arranging plural punching holes 100A having small diameters. The cooling gas rising upwardly from a lower portion is made to upwardly flow via the punching holes 100A. Simultaneously, the shielding capability against high frequency is enhanced. As described, the punching metal having plural apertures in a center portion may be used as the end plate 98. In this case, it is possible to form the gas flow hole 100 as one large hole having a large diameter. It is also possible to attach punching metal to the gas flow hole 100 of the large diameter.

The exhaust box 102 is formed substantially like a square. The inner surfaces of the exhaust box 102 surround gas flow holes 100. A compartment wall 108 in a U-like shape is further formed in the exhaust box 102, wherein one sidewall of the exhaust box 102 is common to one sidewall of the exhaust box 102. A pair of distribution holes 110 are formed on the opposite sides of the compartment wall 108. The distribution holes 110 are internally connected to the gas exhaust opening 104 via a flow path 112 formed between the wall surface of the exhaust box 102 and the compartment wall 108.

Therefore, the above cooling gas which flows out of the plural punching holes 100A flows inside the flow path 112 via the pair of distribution holes 110 formed in the compartment wall 108, and flows toward the duct 83 of the factory from the gas exhaust opening 104. The shape of the exhaust box 102 is not limited to a rectangle-like shape and may be a circle-like shape. Further, the shape of the compartment wall 108 may be shaped like a circle. Furthermore, the gas exhaust opening 104 may be provided in the ceiling portion of the exhaust box 102 instead of the sidewall to thereby upward extract the cooling gas. The exhaust tube 106 is provided with a flow control valve 113 to enable controlling of the volumetric flow rate.

Referring back to FIG. 1, a total operational control of the plasma process apparatus 22 such as start and stop of gas supply, setup of the high frequency power source 66, switching on and off of the high frequency power source 66, and setup of a process pressure is carried out by an apparatus control unit 114 including a computer and the like. The apparatus control unit 114 includes a recording medium 116 such as a flexible disc, a compact disc (CD), a flash memory and a DVD, which records a program readable by a computer for controlling the start and stop of gas supply, the setup of the high frequency power source 66, switching on and off of the high frequency power source 66, and the setup of a process pressure.

Next, an example of forming a film with plasma using a plasma process carried out by the plasma process apparatus configured as above is described. Specifically, oxygen is used as the first gas and an aminosilane-based gas is used as the second gas in a film forming process of forming a sacrificial oxide layer at around room temperature, as an example. The above described DIPAS may be used as the aminosilane-based gas.

Referring to FIG. 1 and FIG. 2, a wafer boat 28 having 300 mm wafers having an ordinary temperature and as many as 50 to 150 pieces mounted on it is upwardly loaded into a processing container 24 having room temperature, e.g. 23° C. to 27° C., from a lower end opening of the processing container 24. The lower end opening of the processing container 24 is hermetically closed by a lid 34.

The inside of the processing container 24 is evacuated to vacuum to thereby maintain a preset process pressure inside the processing container 24. Then, a first gas and a second gas are supplied while controlling the flow amounts of the first and second gases from a gas supplying unit first gas supplying unit 46 and a gas supplying unit second gas supplying unit 48, respectively. Simultaneously, a high frequency power source (RF power source) is switched on to thereby generate plasma inside a plasma generating box 62 of an activating unit 58.

Specifically, the oxygen gas being the first gas is horizontally ejected from gas ejection holes 50A of the first gas nozzle 50. The aminosilane-based gas being the second gas is horizontally ejected from gas ejection holes 52A of the second gas nozzle 52. The oxygen gas is activated by plasma generated inside the plasma generating box 62 to generate an active species such as ozone. The active species reacts with the aminosilane-based gas to thereby form a sacrificial oxide layer on a surface of the wafers W.

During the plasma film forming process, heat generated by the plasma is gradually accumulated inside a shield cover 72 for shielding from high frequency. However, in the present invention, the inside of the shield cover 72 is cooled by a cooling gas supplied from a cooling device 74. Therefore, it is possible to prevent temperature rises of the processing container 24 and the wafer W while maintaining the temperatures of the processing container 24 and the wafer W at about room temperature.

Said differently, the atmosphere inside the shield cover 72 is constantly depressurized since the atmosphere is connected to the duct 83 of a factory, being the exhaust source 80, and exhausted through the duct 83. Therefore, a clean air maintained to have a temperature of about 23 to 27° C. is taken into a cooling gas guiding duct 92 as a cooling gas from a gas intake hole 94 provided in a lower portion of the shield cover 72 along an arrow 120 as illustrated in FIG. 1 and FIG. 3. Then, the cooling gas flows inside the cooling gas guiding duct 92, and is taken through a connection hole 96 and a gas intake hole 90, formed at both ends of the semicircular arc shape of the cooling gas guiding duct 92, into a gas duct 86 of an exhaust header 78 along an arrow 122 illustrated in FIG. 3. The cooling gas flows inside the ring-like gas duct 86 in two directions, and flows into the shield cover 72 from four gas flow holes 88.

The cooling gas which flows into the shield cover 72 upwardly moves inside a space 82 between the shield cover 72 and the processing container 24 along an arrow 84 illustrated in FIG. At this time, the cooling gas cools a side surface of the processing container 24 of which temperature tends to increase, and heat generated by plasma accumulated in the space 82 is carried and emitted by the cooling gas. The upward movement (flow) of the cooling gas occurs in substantially entire periphery of the processing container 24.

The cooling gas upwardly which flows inside the shield cover 72 converges and flows into an exhaust box 102 via punching holes 100A of gas flow holes 100 in the exhaust header 78. The cooling gas upwardly which flows inside the shield cover 72 converges and flows into an exhaust box 102 via punching holes 100A of gas flow holes 100 in the exhaust header 78. Further, the cooling gas flows inside a flow path 112 between the exhaust box 102 and a compartment wall 108 via a pair of distribution holes 110 along an arrow 124 illustrated in FIG. 5. Furthermore, the cooling gas flows on a side of the duct 83 of the factory via an exhaust tube 106 from an exhaust gas opening 104.

As described, since the inside of the shield cover 72 is cooled, it is possible to maintain the temperatures of the processing container 24 and the wafers W to be about room temperature by preventing temperature rises of the processing container 24 and the wafers W. When one batch process ends and another batch process is started, heat is not accumulated in the shield cover 72 in the embodiment. Therefore, it is possible to maintain the temperatures of the processing container 24 and the wafers W to be about room temperature by preventing temperature increases of the processing container 24 and the wafers W. Thus, it is possible to keep high reproducibility of plasma processes.

Said differently, when batch processes of processing plural wafers W at once are continuously carried out, it is possible to maintain the temperatures of the processing container 24 and the wafers W to be about room temperature by causing the cooling gas to flow inside the shield cover 72 and cooling the processing container 24 and the wafers W in order to emit heat accumulated in the space 82. Thus, it is possible to maintain high reproducibility of plasma processes (film forming processes).

As described, according to the embodiment of the present invention, in the plasma process apparatus 22, the plural objects to be processed such as semiconductor wafers W are held inside the processing container 24 and a necessary gas is introduced into the processing container 24, an active species of the gas is generated by the plasma generated by the activating unit 58, and the objects to be processed undergo a plasma process. The plasma process apparatus 22 includes the cylindrical shield cover 72 formed to surround the periphery of the processing container 24 to shield from high frequency, and the cooling device 74 which causes the cooling gas to flow through the space 82 between the shield cover 72 and the processing container 24 during the plasma process. The cooling gas flows along the outer side of the processing container 24 with the cooling device 74 during the plasma process. Therefore, heat generated by the plasma does not accumulate in the space 82 between the shield cover 72 and the processing container 24. As a result, when the plasma process is carried out at a low temperature range of about the room temperature, the process temperature can be maintained low enough to improve reproducibility of the plasma process such as the film forming process.

<Evaluation of Cooling Device of the Embodiment of the Present Invention>

Figure 14:
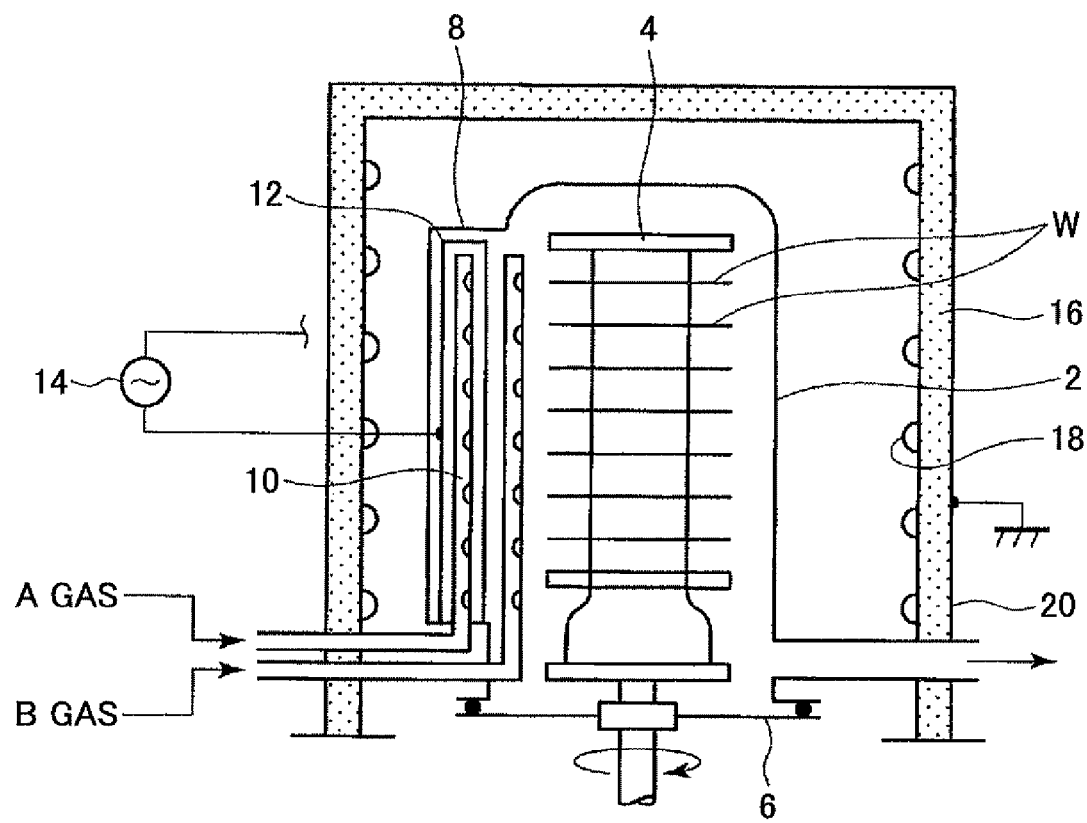
FIG. 14 schematically illustrates an example of a conventional plasma process apparatus of an upright type.

Next, a temperature change of the space 82 formed between the processing container 24 and the shield cover 72 is measured when plural batch processes using plasma are continuously carried out by the above-described plasma process apparatus of the embodiment according to the present invention including the cooling device 74. An evaluation result of the temperature change is described. Batch processes using plasma are carried out by a conventional plasma process apparatus including a heater covered by a cylindrical insulating material as illustrated in FIG. 14. The result in the conventional plasma apparatus obtained without operating the heater is described, too.

Figure 6A:
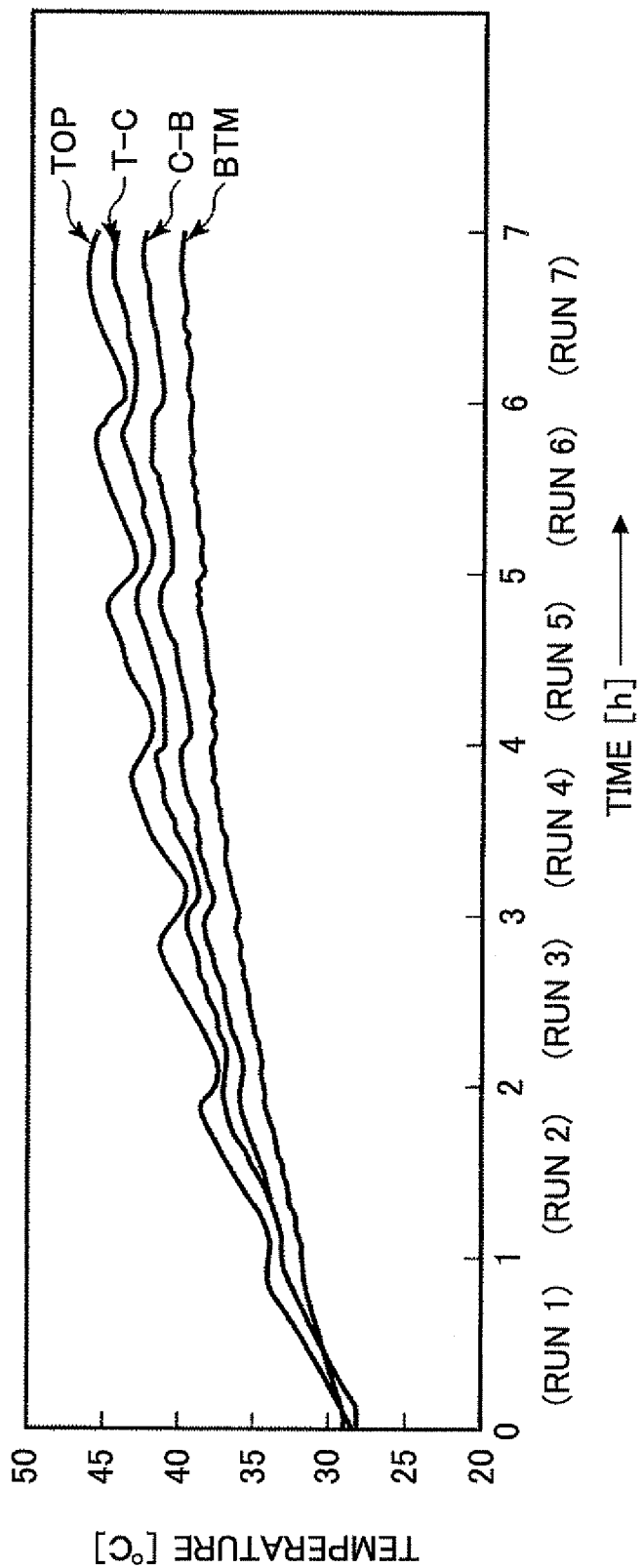
FIG. 6A and FIG. 6B are graphs illustrating a temperature change in a space while a batch process is continuously conducted.
Figure 6B:
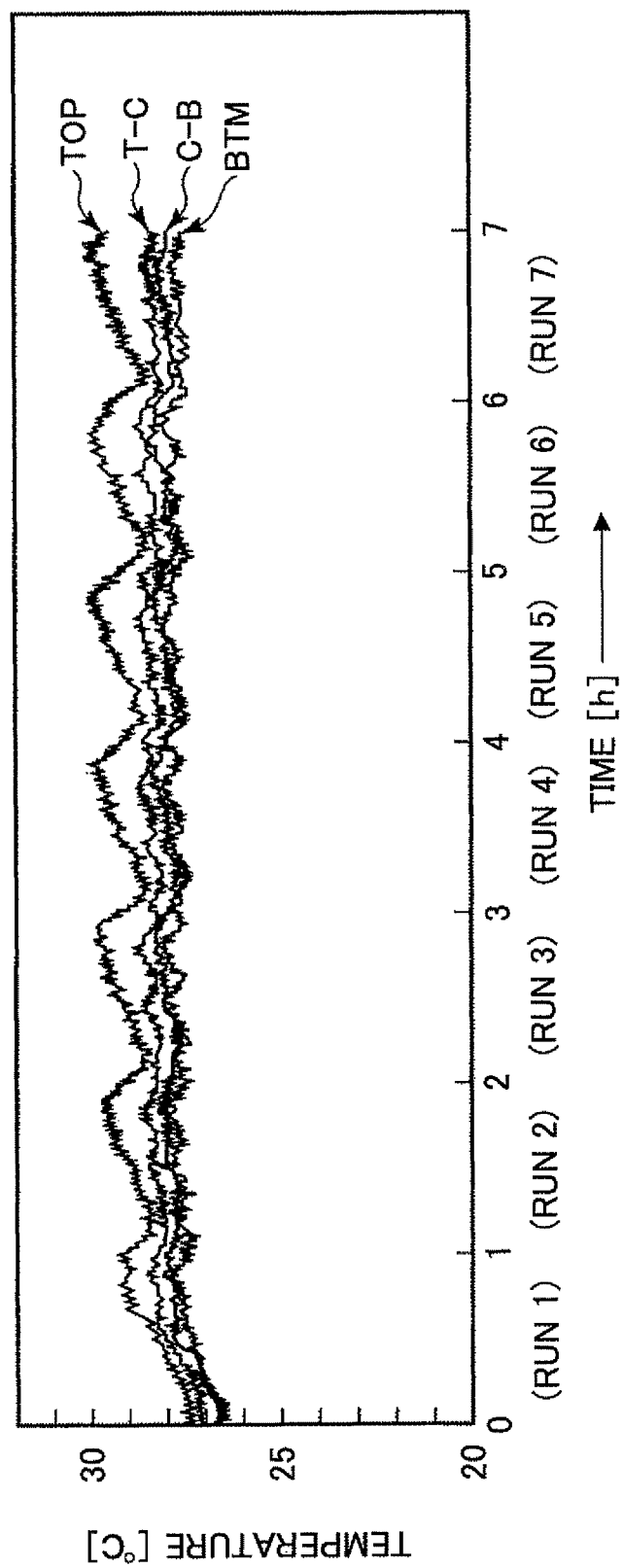

A film forming process of wafers with as many as 117 pieces are carried out for 60 minutes in one batch process. The batch processes are continuously carried out 7 times (RUN 1 to RUN 7). FIG. 6A and FIG. 6B illustrate a temperature change of the space during the process of continuously carrying out the batch processes. FIG. 6A illustrates a case of the conventional plasma process apparatus. FIG. 6B illustrates a case of the plasma process apparatus of the embodiment according to the present invention. In the plasma process apparatus of the embodiment according to the present invention illustrated in FIG. 6B, a volumetric flow rate inside the shield cover is set as 0.55 m$^3$/min.

FIG. 7A, FIG. 7B, FIG. 7C and FIG. 7D illustrate temperature changes in the space obtained from the graphs of FIG. 6A and FIG. 6B. Results of experiments carried out by changing the volumetric flow rate to three types. The wafers W held by the wafer boat in multistage are separated into four areas in the height direction. The temperature of the space in the uppermost stage is referred to as "TOP". The temperature of the space in the stage immediate below "TOP" is referred to as "T-C" which stands for top center. The temperature of the space in the stage immediate below "T-C" is referred to as "C-B" which stands for center bottom. The temperature of the space in the lowermost stage immediate is referred to as "BTM" which stands for bottom. The temperatures are measured by a thermocouple placed in the space 82. The temperature of the space 82 when the process is started is 27° C. in all of the processes.

Referring to FIG. 6A, in the case of the conventional plasma process apparatus, the temperatures of the space in all areas of "TOP", "T-C", "C-B" and "BTM" gradually increase as the batch process is repeated. Finally, the temperature of the space increases up to about 40° C. to 46° C. Thus, reproducibility is known to be insufficient. Specifically, as illustrated in FIG. 7A, the temperature differences Δ of the space between the maximum temperature and the minimum temperature are 18.5° C. in "TOP", 16.5° C. in "T-C", 13.6° C. in "C-B" and 10.7° C. in "BTM". Thus, the temperature of the space greatly changes among the batch processes. This result is not preferable.

On the contrary, as illustrated in FIG. 6B, the temperatures of the space in all areas "TOP", "T-C", "C-B" and "BTM" reside in a range of substantially 27° C. to 30° C. from RUN 1 to RUN 7. Thus, the batch processes can be continuously carried out without increasing the temperature of the space. Since the temperature is thus stably maintained, it is known that reproducibility can be enhanced.

FIG. 7C shows the temperature difference between the maximum value (Max) and the minimum value (Min) of the temperature of the space in the experiment illustrated in FIG. 6B. The temperature differences in "TOP", "T-C", "C-B" and "BTM" are 3.6° C., 1.9° C., 1.4° C. and 1.2° C., respectively. The temperature differences become much smaller than those in the conventional plasma process apparatus, and much better results are obtainable in the plasma process apparatus of the embodiment according to the present invention than in the conventional plasma process apparatus. FIG. 7B and FIG. 7D illustrate results obtained when experiments similar to that in FIG. 6B are conducted using the plasma process apparatus of the embodiment according to the present invention by changing only the volumetric flow rate to 0.35 m$^3$/min in FIG. 7B and 0.72 m$^3$/min in FIG. 7D.

With these results, the temperatures of the space in "TOP", "T-C", "C-B" and "BTM" are not changed from a preset temperature of 27° C. in FIG. 7B and FIG. 7D. These results are very good. Referring to FIG. 7B, the temperature differences are 5.2° C., 3.9° C., 2.2° C. and 1.4° C., respectively.

Referring to FIG. 7D, the temperature differences are 3.0° C., 1.7° C., 1.5° C. and 1.2° C., respectively. These results are also very good. Thus, it is known that reproducibility in the plasma process can be enhanced.

Referring to FIG. 7B, when the volumetric flow rate is reduced to 0.35 m$^3$/min, the temperatures of the space in "TOP" and "T-C" increase up to 32.5° C. and 31.1° C., respectively. However, these temperatures reside in a range of ±6° C. from the preset temperature of 27° C. Therefore, even though the volumetric flow rate is 0.35 m$^3$/min as in FIG. 7B, the plasma process apparatus of the embodiment is sufficient for practical use.

Modified Example 1

Next, Modified Example 1 of the present invention is described. In the above embodiment, the cooling gas is always made to flow into the space 82 inside the shield cover 72 using the cooling device 74 during the film forming process. However, there is a case where the cooling gas is not made to flow in order to improve throughput depending on an atmosphere in which a plasma process apparatus 22 is installed, for example, a temperature condition in a clean room. Specifically, when the film forming processes are repeated, an unnecessary film, which causes particles to form when the unnecessary film peels off, cumulatively deposits these particles on an inner wall of a processing container 24. Therefore, the unnecessary film is periodically or occasionally removed by a cleaning gas before the unnecessary film peels off.

In cleaning to remove the unnecessary film, for example, the cumulative film thickness of the unnecessary film depositing on the sidewall of the processing container 24 is controlled. At every time when the film thickness reaches a preset reference value in a range of, for example, about 1 thru 20 μm, cleaning may be done. In this case, the film quality of the unnecessary film depositing in the inner wall of the processing container 24 may delicately change depending on the temperature of the processing container 24 during film formation. For example, it is confirmed by the inventors of the present invention that there may be a case where the unnecessary film is apt to peel off before the cumulative film thickness reaches the reference value. The reference value is preset depending on a film type, a process condition or the like.

Specifically, if the temperature of the sidewall of the processing container 24 is excessively reduced by an operation of the cooling device 74, the unnecessary film is apt to peel off as the temperature of the sidewall is reduced. Thus, it is confirmed by the applicant that there may occur a phenomenon that particles are generated by peeling of the unnecessary film even though the cumulative film thickness is the preset reference value or less. In Modified Example 1 of the present invention, it is determined whether the cooling device is operated depending on an installing condition of the plasma process apparatus 22.

Figure 8:
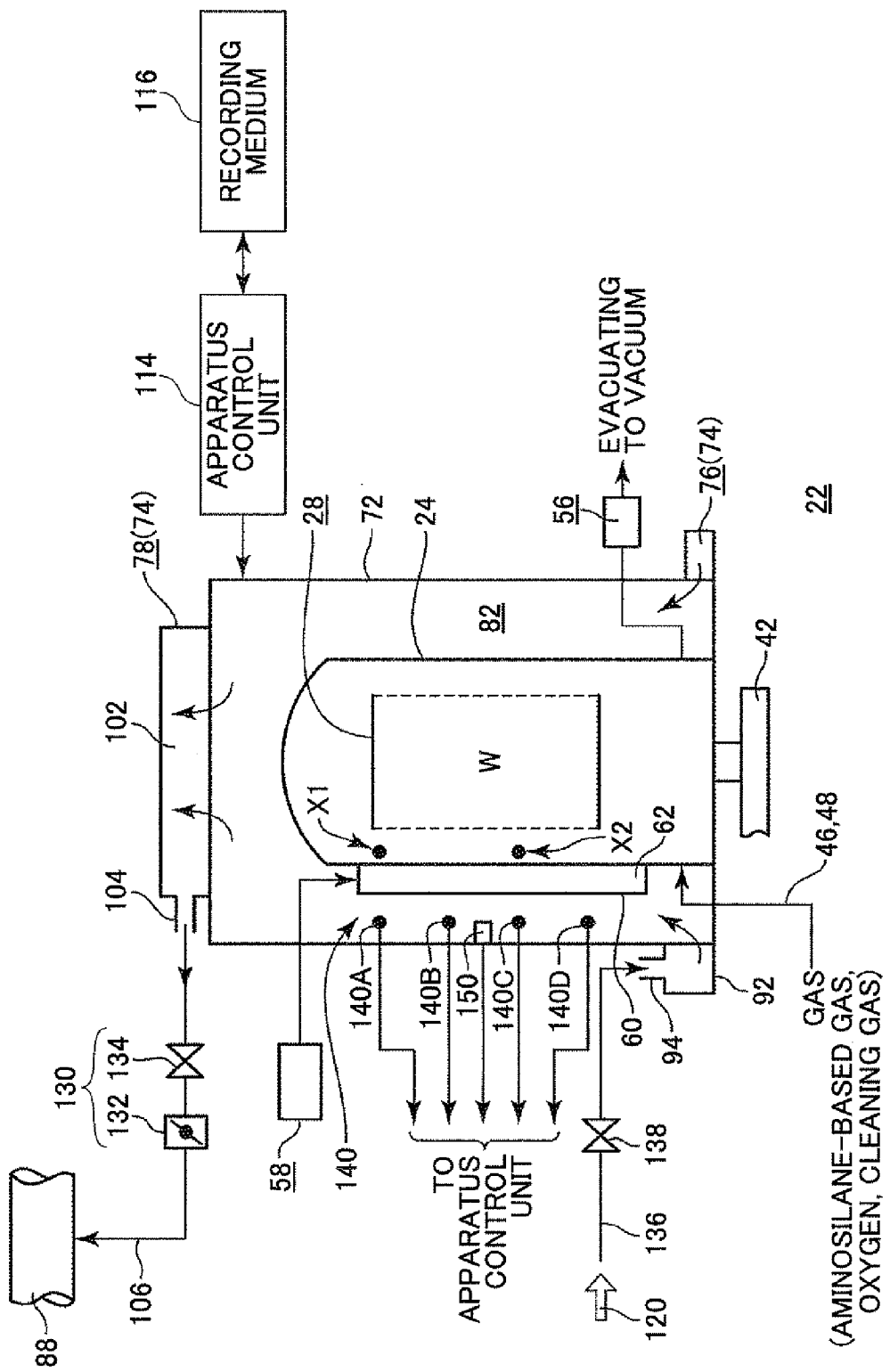
FIG. 8 schematically illustrates an example of a plasma process apparatus according to Modified Example 1 of the present invention.

FIG. 8 schematically illustrates an example of the plasma process apparatus according to Modified Example 1 of the present invention. Referring to FIG. 8, a basic structure is the same as that of the plasma process apparatus described above with reference to FIG. 1 thru FIG. 5 except for points described below. The same reference symbols are attached to portions having a structure which is the same as the structure described above, and description of these portions is omitted.

A valve device 130 is located in the mid-course of the exhaust tube 106 connecting the gas exhaust opening 104 of the exhaust header 78 of the cooling device 74 to the exhaust source 88. The valve device 130 is formed by serially arranging a flow rate control valve 132 like a butterfly valve and a first on-off valve 134. A gas supply tube 136 is connected to a gas inlet 94 of a cooling gas guiding duct 92 provided in the intake header 76 of the cooling device 74. A second on-off valve 138 is provided in the mid-course of the gas supply tube 136. The clean air having substantially the same temperature as that in the clean room is suctioned as a cooling gas along an arrow 120. It is possible to open the gas inlet 94 to the clean room without providing the gas supply tube 136.

A thermometry unit 140 for measuring a temperature of the atmosphere in the space 82 is provided in the space 82 formed between the processing container 24 and the shield cover 72. Specifically, the thermometry unit 140 includes plural thermocouples 140A, 140B, 140C and 140D which inwardly extend from the sidewall of the shield cover 72. The number of the thermocouples is, for example, four. These four thermocouples 140A, 140B, 140C and 140D are arranged at even intervals in correspondence with a region where the wafers W are accommodated in the processing container 24.

Said differently, the thermocouple 140A is positioned in the uppermost stage. The thermocouple 140B is positioned immediately below the thermocouple 140A. The thermocouple 140C is positioned immediately below the thermocouple 140B. The thermocouple 140D is positioned in the lowermost stage. Therefore, these thermocouples 140A, 140B, 140C and 140D correspond to "TOP", "T-C", "C-B" and "BTM" in the downward direction. The outputs from the thermocouples 140A, 140B, 140C and 140D are input into the apparatus control unit 114, for example. Further, a differential pressure gauge 150 for obtaining the differential pressure between the pressure inside the space 28 and the pressure in the clean room is provided in the space 82. Further, a differential pressure gauge 150 for obtaining the differential pressure between the pressure inside the space 28 and the pressure in the clean room is provided in the space 82. An output from the differential pressure gauge 150 is input in, for example, the apparatus control unit 114.

With the above-described structure of Modified Example 1 maintained in a standby state, the plasma process is carried out with the valve device 130 closed when a measured temperature of the thermometry unit 140 is lower than a preset threshold temperature when the atmosphere in the space 82 undergoes evacuation at the preset volumetric flow rate. The operation of the valve device 130 may be controlled by the apparatus control unit 114 or manually conducted by an operator.

Specifically, since the strength of deposition of the unnecessary film delicately changes depending on the temperature of the processing container 24 during the plasma process of forming the film as described above, when the cooling gas is made to flow by operating the cooling device 74, the unnecessary film which is apt to peel off depending on an installation environment of the plasma process apparatus 22 may be generated. For example, when the temperature of the atmosphere used as the cooling gas in the clean room is high, the temperature of the cooling gas itself to be supplied is also high. Therefore, when the cooling gas is made to flow by operating the cooling device 74 during the plasma process, the processing container 24 may not be excessively cooled. Thus, the adhered unnecessary film is not apt to peel off.

On the contrary thereto, when the temperature of the atmosphere used as the cooling gas in the clean room is low, the temperature of the cooling gas itself to be supplied is also low. Therefore, even though the cooling gas is made to flow by operating the cooling device 74 during the plasma process, the processing container 24 may be excessively cooled. Thus, the adhered unnecessary film is apt to peel off.

In this case, a portion on which particles are likely generated is inside the plasma generating box 62. When thermocouples are arranged in order to detect the temperature inside the plasma generating box 62, an abnormal electrical discharge may be caused because a high-frequency electrode is provided in the vicinity of the plasma generating box 62. Therefore, it is not practical to arrange the thermocouples.

In Modified Example 1, there is obtained the temperature of the atmosphere, at which the sidewall of the processing container 24 is excessively cooled when the cooling gas cooling the sidewall of the processing container 24 flows inside the space 82. When the sidewall of the processing container 24 is excessively cooled, the flow of the cooling gas is stopped without operating the cooling device 74.

In order to realize the above, the cooling gas is made to flow inside the space 82 in the stand-by state of the plasma process apparatus 22. It is determined whether the cooling gas is made to flow during the plasma process based on the temperature of the atmosphere inside the space 82. Specifically, in a case where the measured temperatures of the thermocouples 140A, 140B, 140C and 140D are lower than a preset threshold temperature, e.g. 33° C., when the space 82 is evacuated at a preset volumetric flow rate with which a pressure difference between the pressure in the space and the atmosphere pressure becomes about −100 Pa while maintaining the plasma process apparatus 22 in the stand-by state, the first on-off valve 134 of the valve device 130 is closed to prevent the cooling gas from flowing inside the space 82 during the plasma process for forming the film. Namely, operation of the cooling device is stopped.

On the contrary, in a case where the measured temperature is 33° C. or more, the first on-off valve 134 of the valve device is opened to cause the cooling gas to flow. Namely, the cooling device 74 is operated. It is preferable to open and close the second on-off valve 138 in association with opening and closing of the first on-off valve 134. The threshold temperature of 33° C. is an example when the film forming gas is an aminosilane-based gas like DIPAS.

It is determined whether the first and second on-off valves 134 and 138 are opened and closed basically by determining as described above when the plasma process apparatus 22 is installed inside the clean room. Hereinafter, the first and second on-off valves 134 and 138 are basically maintained to be opened or closed while the plasma process and the cleaning process are continuously repeated for forming the film. Meanwhile, depending on the condition of cleaning, the cooling gas may be made to flow. Further, in a case where the installation environment is changed by, for example, maintenance, it is necessary to determine whether the cooling device 74 is operated again as described above.

The stand-by state represents a state in which heaters or the like of various wiring are switched on but the activating unit 58 is switched off after the power is shut off in the plasma process apparatus, and the temperature of the processing container 24 does not vary and is stabilized because plasma is not yet generated. For example, the stand-by state may be realized one day or more after the power is shut off in the plasma process apparatus. For example, the stand-by state may be realized seven hours or more after the process (RUN) of forming the film ends.

<Verification Experiments>

Figure 9:
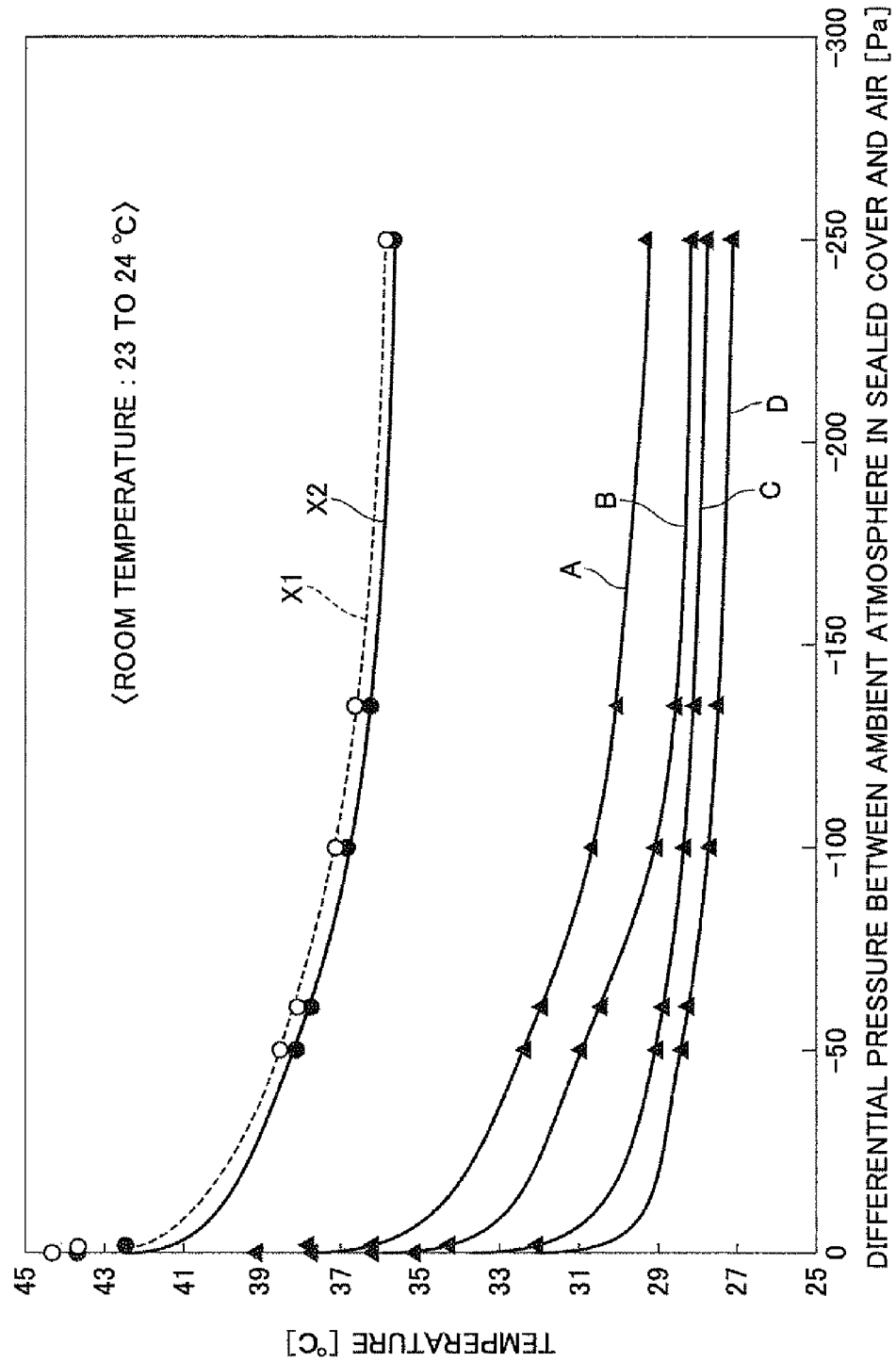
FIG. 9 is a graph illustrating a relationship between a differential pressure between an inner pressure of a shield cover in Modified Example 1 of the present invention and the atmosphere pressure and an inner temperature of the shield cover.
Figure 10:
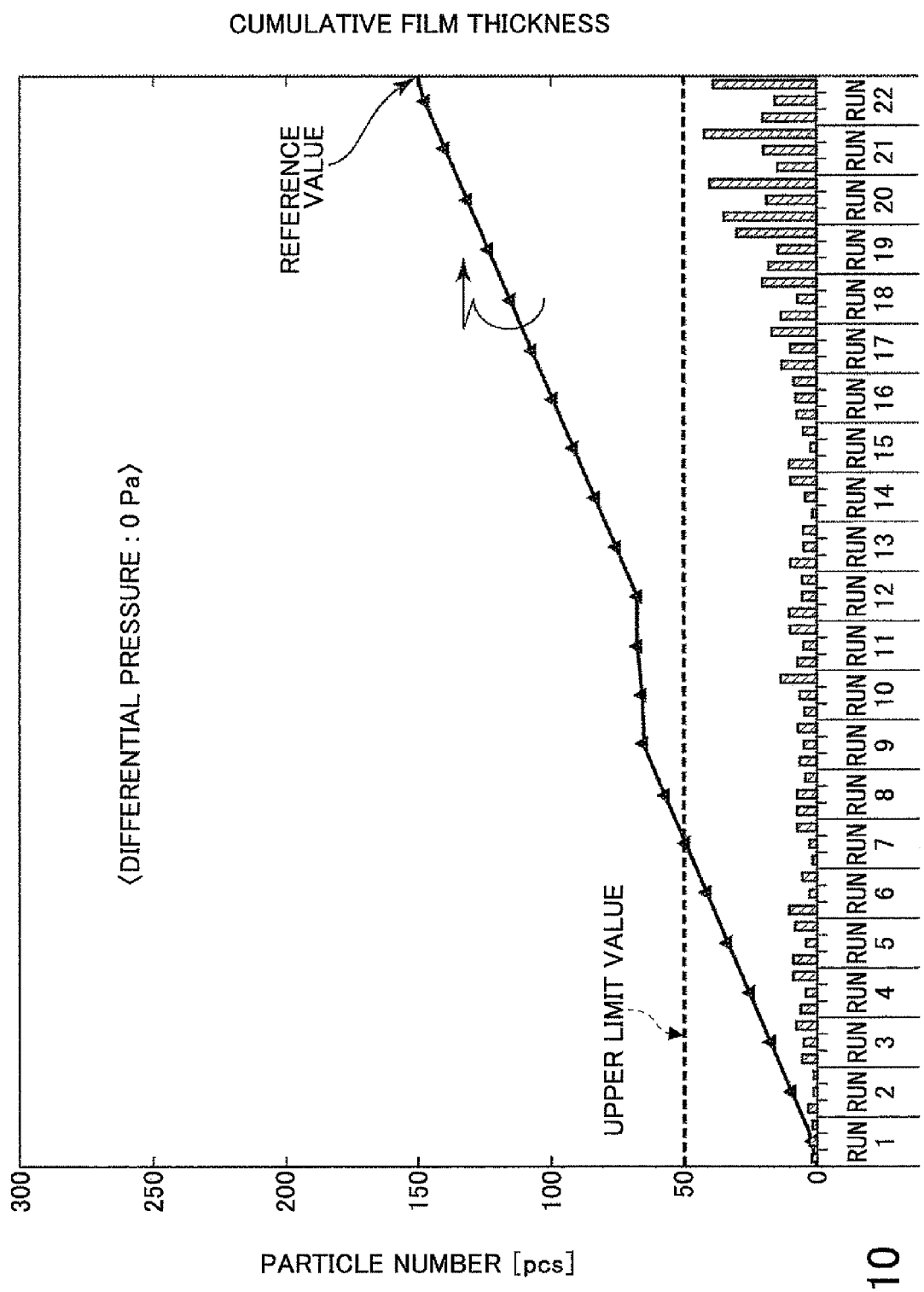
FIG. 10 illustrates a relationship among a run number, a particle number and a cumulative film thickness when the differential pressure is 0 Pa.
Figure 11:
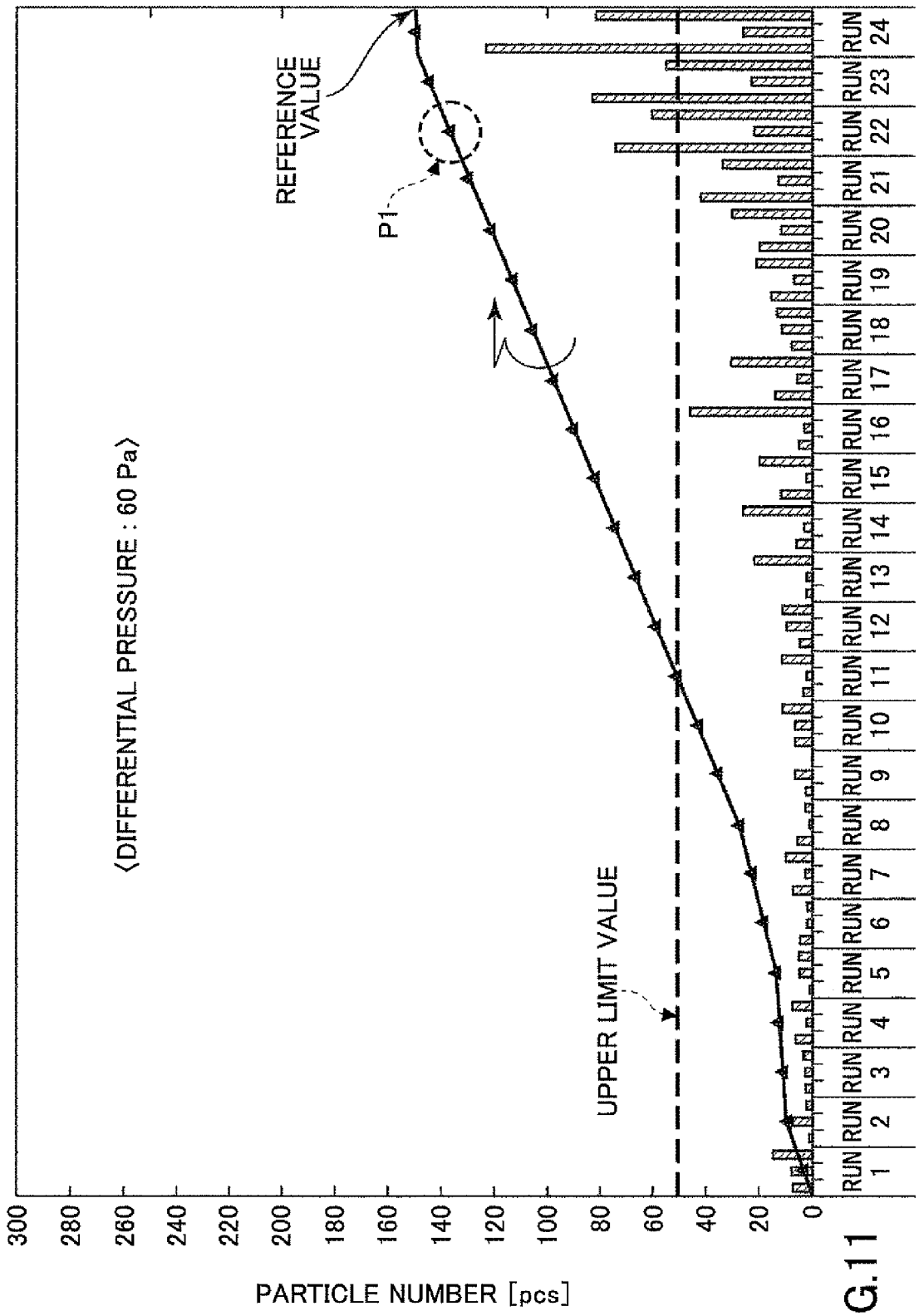
FIG. 11 illustrates a relationship among the run number, the particle number and the cumulative film thickness when the differential pressure is 60 Pa.
Figure 12:
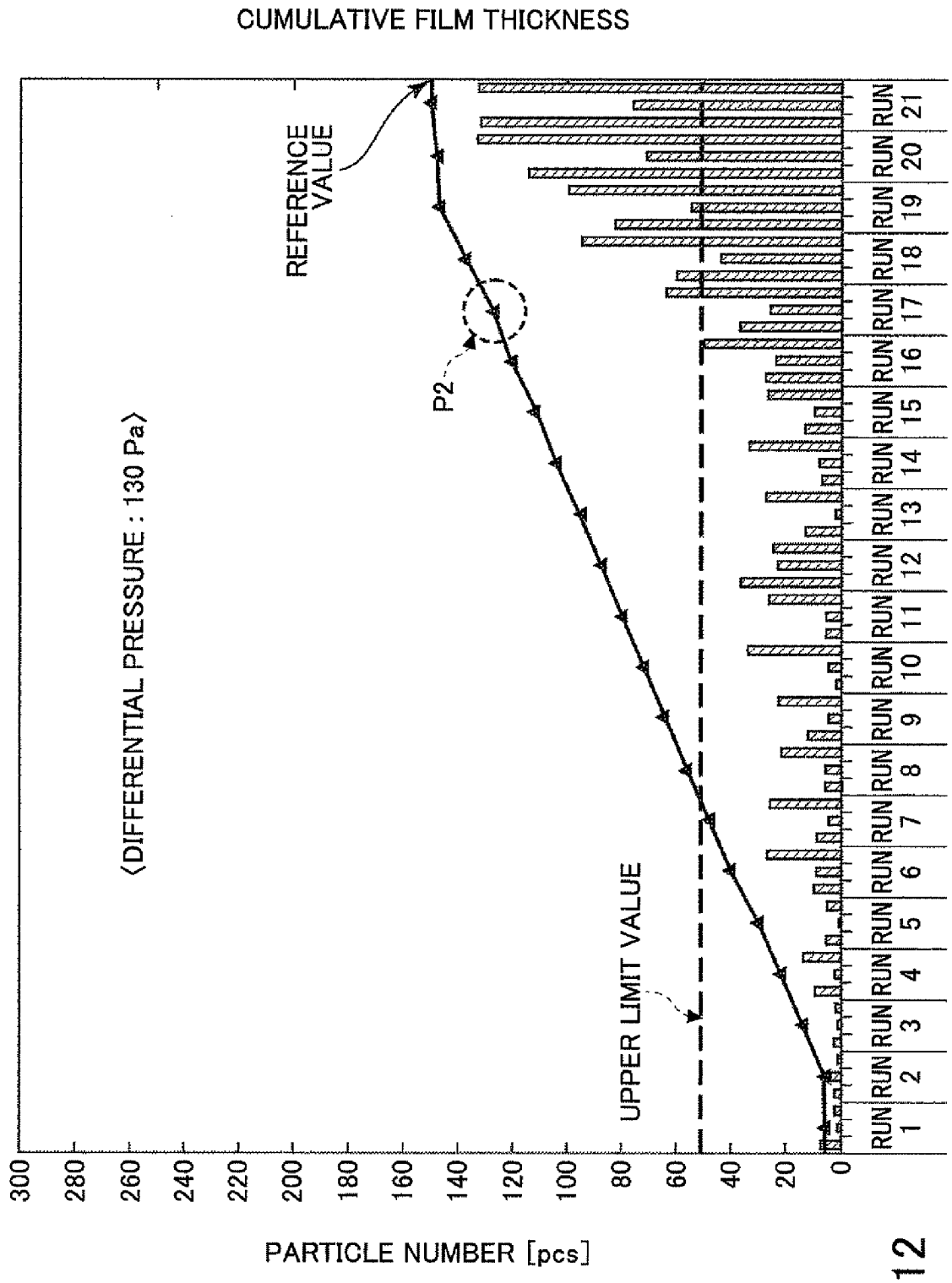
FIG. 12 illustrates a relationship among the run number, the particle number and the cumulative film thickness when the differential pressure is 130 Pa.
Figure 13:
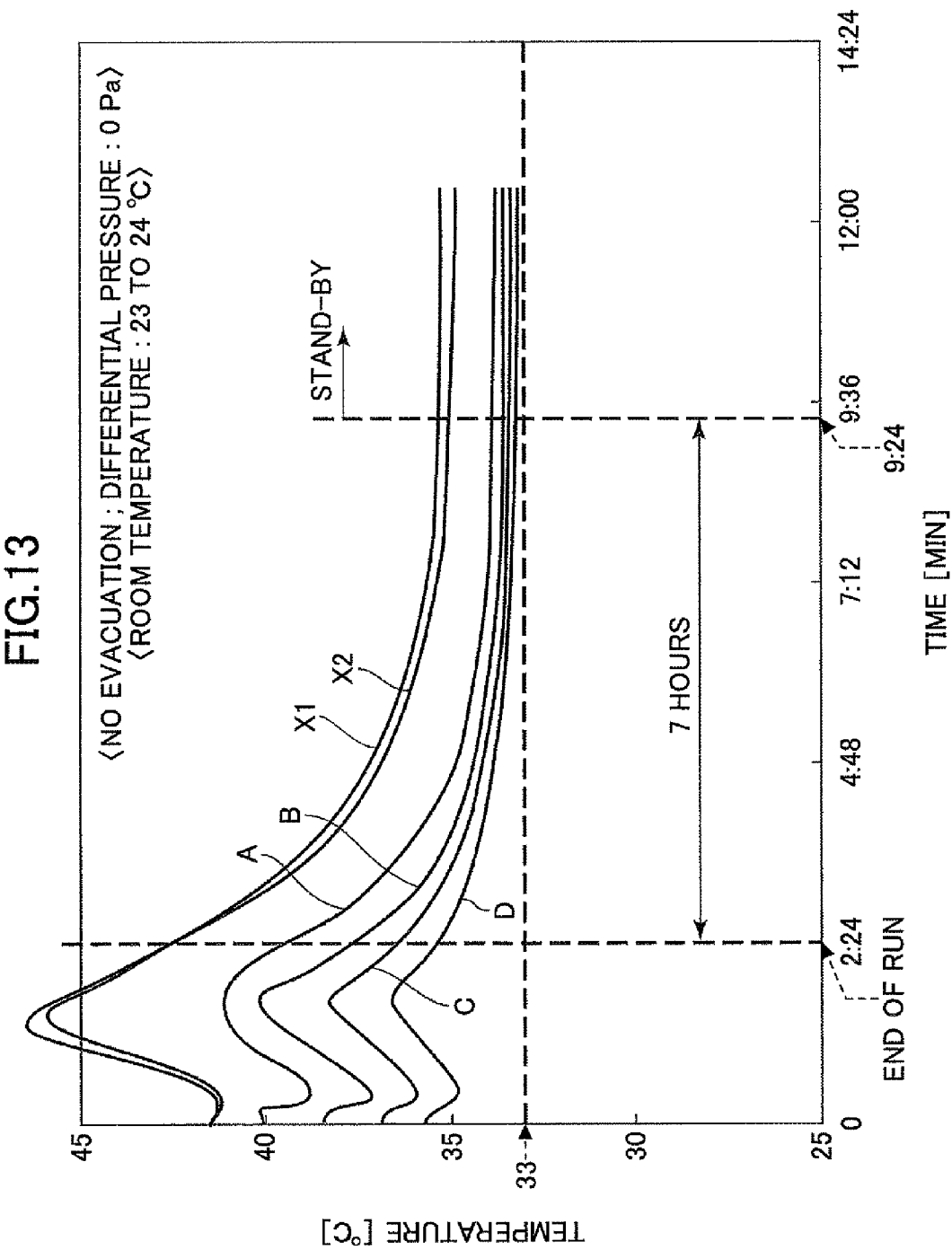
FIG. 13 is a graph illustrating a temperature change inside the shield cover after a plasma process, i.e. runs, finishes.

Next, the content of the verification experiments of Modified Example 1 is described. FIG. 9 is a graph illustrating a relationship between a differential pressure between the inner pressure of the shield cover in Modified Example 1 of the present invention and the atmosphere pressure and the inner temperature of the shield cover. FIG. 10 illustrates a relationship among a run number, a particle number and a cumulative film thickness when the differential pressure is 0 Pa. FIG. 11 illustrates a relationship among the run number, the particle number and the cumulative film thickness when the differential pressure is 60 Pa. FIG. 12 illustrates a relationship among the run number, the particle number and the cumulative film thickness when the differential pressure is 130 Pa. FIG. 13 is a graph illustrating a temperature change inside the shield cover after a plasma process, i.e. runs, finishes. The differential pressure is changed from 0 Pa to −250 Pa. The plasma film forming process is carried out to evaluate the particles.

In the case where the differential pressure is 0 Pa, both of the first and second on-off valves 134 and 138 are closed to prevent the cooling gas from flowing into the space. In the case where the differential pressure is not 0 Pa, both of the first and second on-off valves 134 and 138 are opened and appropriately adjusted to enable a change of the differential pressure. Therefore, the differential pressure in the abscissa of FIG. 9 corresponds to the volumetric flow rate. When the differential pressure is small, the volumetric flow rate of the cooling gas is small. The volumetric flow rate of the cooling gas gradually increases as the differential pressure increases.

Referring to the graph of FIG. 9, Curve A represents the temperature of the thermocouple 104A, Curve B represents the temperature of the thermocouple 104B corresponding to CTP in FIG. 8, Curve C represents the temperature of the thermocouple 104C corresponding to CBT in FIG. 8, and Curve D represents the temperature of the thermocouple 104D corresponding to BTM in FIG. 8. Curve X1 represents the temperature at the position of Point X1 illustrated in FIG. 8. Curve X2 represents the temperature at the position of Point X2 illustrated in FIG. 8. Then, the temperature inside the clean room in which the plasma process apparatus is installed is about 23° C. to 24° C.

As clearly shown from the graph of FIG. 9, the temperatures are largest in all of the temperature measuring positions. For example, the temperatures of Points X1 and X2 represented by Curves X1 and X2 are about 44° C. to 45° C., and the temperatures of the thermocouples 140A to 140D represented by Curves A to D are about 35° C. to 39° C. The temperatures gradually decrease as the differential pressure increases and the volumetric flow rate increases.

The particles are evaluated by carrying out the film forming process by plural times of RUN at differential pressures of 0 Pa, −2 Pa, −50 Pa, −60 Pa, −100 Pa, −130 Pa and −250 Pa, respectively. As a result, when the differential pressure is 0 Pa, the particle number is less than the upper limit value of 50 pieces even though the cumulative film thickness becomes the preset value or more. Therefore, the result is acceptable. When the differential pressure is between −2 Pa and −250 Pa, the cumulative film thickness is smaller than the reference value and the particle number reaches the upper limit value of 50 pieces. Therefore, the result is not acceptable. Namely, even when the cooling gas of a slight quantity corresponding to about −2 Pa flows into the space, a slight temperature drop caused by flowing of the cooling gas affects the particle number to increase the number of the particles to 50 pieces before the cumulative film thickness reaches the reference value.

As a result, it is determined that the cooling device 74 is not operated under this installation environment to carry out the plasma process for forming the film without flowing of the cooling gas. FIG. 10 to FIG. 12 illustrate a part of the result. FIG. 10 illustrates a case where the differential pressure is 0 Pa. FIG. 11 illustrates a case where the differential pressure is 60 Pa. FIG. 12 illustrates a case where the differential pressure is 130 Pa. In FIG. 10 to FIG. 12, the left ordinate represents the particle number (bar graph), and the right ordinate represents the cumulative film thickness (line graph).

One RUN designates one batch process. The particles are measured in wafer positions of "TOP" (top), "CTR" (center) and "BTM" (bottom) in each RUN. The counted numbers of the particles are illustrated by the bar graph in the above order. The upper limit value of the particle number is set as 50 pieces. The reference value of the cumulative film thickness is a specific value in a range of about 1 μm thru 20 μm as described above. In the case of the differential pressure of 0 Pa illustrated in FIG. 10, the particle number does not reach the upper limit value of 50 pieces even though the cumulative film thickness reaches the reference value during RUN 1 to RUN 22. Therefore, the result is preferable.

On the contrary, in the case of the differential pressure of 60 Pa illustrated in FIG. 11, the particle number reaches the upper limit value of 50 pieces at Point P1 during RUN 1 to RUN 22. Therefore, the result is not preferable. Further, in the case of the differential pressure of 130 Pa illustrated in FIG. 12, the particle number reaches the upper limit value of 50 pieces at Point P2 during RUN 1 to RUN 22. Therefore, the result is not preferable. Therefore, it is known that the number of the particles can be gradually decreased as the differential pressure is reduced. As described, it is determined that the cooling device 74 is not operated under this installation environment to carry out the plasma process for forming the film without flowing of the cooling gas.

Next, a relationship between the differential pressure and the volumetric flow rate is described. The capacity of the space 82 (the capacity of the shield cover 72—the volume of an outer shell of the processing container 24) is about 250 liter. When the cooling gas is made to flow into the space 82, the opening degree of the flow rate control valve 132 is previously adjusted to be a differential pressure in a range of −40 Pa thru −100 Pa. In the case where the differential pressure is −40 PA, the volumetric flow rate is about 0.45 m³/min. In the case where the differential pressure is −100 PA, the volumetric flow rate is about 0.70 m³/min. The volumetric flow rate may be arbitrarily determined depending on a clean room in which the plasma process apparatus is installed. When the plasma process apparatus is actually installed in the clean room, the flow rate control valve 132 is used to previously adjust the volumetric flow rate to be an arbitrary volumetric flow rate in a range of 0.45 m³/min to 0.70 m³/min, namely the differential pressure in a range of −40 Pa to 100 Pa.

The condition of stand-by in the case of the differential pressure of 0 Pa is described below. FIG. 13 illustrates temperatures of various portions of the plasma process apparatus after the plasma process (RUN) for forming the film is conducted once. Referring to the graph of FIG. 13, Curve A, Curve B, Curve C, Curve X1 and Curve X2 represent as described with reference to FIG. 9. Curve A represents the temperature of the thermocouple 104A, Curve B represents the temperature of the thermocouple 104B corresponding to CTP in FIG. 8, Curve C represents the temperature of the thermocouple 104C corresponding to CBT in FIG. 8, and Curve D represents the temperature of the thermocouple 104D corresponding to BTM in FIG. 8. Curve X1 represents the temperature at the position of Point X1 illustrated in FIG. 8. Curve X2 represents the temperature at the position of Point X2 illustrated in FIG. 8. The room temperature is set as 23° C. to 24° C. The space 82 inside the shield cover 72 is not evacuated, and the differential pressure is 0 Pa.

Referring to FIG. 13, when one RUN ends at 2:24, the temperature of the various portions gradually decreases. On and after 9:24, about seven hours after the one RUN ends, the temperatures of the various portions are substantially stabilized. This is the stand-by state. In this case the temperatures of the thermocouples 140A to 140D are stabilized in a range of about 33° C. to 34° C. When the measured temperatures of the thermocouples 140A to 140D are 33° C. or more, it is possible to conditions of the reference value of the cumulative film thickness for satisfying the upper limit value of 50 pieces of the particle number even though the plasma process is conducted using the plasma process apparatus.

Said differently, when the cooling gas is made to flow inside the space 82 at the preset volumetric flow rate using the flow rate control valve 132 in the stand-by condition, it is preferable to operate the cooling device 74 at the time of forming the film. Then, both of the first and second on-off valves 124 and 138 are opened to cool the processing container 24 by flowing of the cooling gas.

In this case, the cooling gas may not be made to flow in order to restrict the generation of particles. However, if the cooling gas is not made to flow, the temperature of the processing container instead increases. If the temperature excessively increases, it becomes hard to remove the unnecessary film adhered to the inner wall of the container at the time of cleaning occasionally carried out. Therefore, it is preferable to flow the cooling gas as described above.

As described, the plasma process apparatus of Modified Example 1 of the present invention further includes the thermometry unit for measuring the temperature of the atmosphere in the space, the exhaust tube provided between the exhaust header and the exhaust source, the valve device which is installed in mid-course of the exhaust tube, and closes during the plasma process in a case where the measured temperature obtained by the thermometry unit when the atmosphere in the space is evacuated with the preset volumetric flow rate is lower than the preset threshold temperature, wherein the atmosphere in the space is evacuated in order to set the differential pressure between the pressure in the space and the atmosphere pressure becomes the preset value. Thus, it is possible to set the condition in which the unnecessary film depositing on the inner wall of the processing container hardly peels off, for example. As a result, a frequency of cleaning may be reduced to improve throughput.

Further, according to a plasma process method of the present invention, it is possible to set the condition in which the unnecessary film depositing on the inner wall of the processing container hardly peels off. As a result, the frequency of cleaning may be reduced to improve throughput.

The above reference value of the cumulative film thickness and the upper limit value of the particle number of 50 pieces are only examples, and the preset invention is not limited thereto. Although the four thermocouples 140A to 140D are provided as the thermometry unit 140, the thermometry unit 140 is not limited thereto. The thermometry unit may be at least one or preferably two or more.

Although the duct 83 for the factory is used as the exhaust source 80 constantly evacuating the atmosphere inside the shield cover 72 in the embodiments, it is possible to install an exhaust pump as an additional exhaust source 80 in the exhaust tube 106 instead of the duct 83 or in addition to the duct 83 to further strongly evacuated the atmosphere. The exhaust pump may be operated during the plasma process.

Although the exhaust box 102 or the like is used in the exhaust header 78, a gas duct 86 having a structure that is the same as the intake header 76, the gas flow holes 88, the gas intake holes 90 used as the gas exhaust opening 104, or the like may be provided on an upper end portion of the shield cover 72.

Further, the sacrificial oxide layer is formed in the plasma process under the ordinary temperature (room temperature) in the embodiments, the present invention is not limited thereto. The present invention is applicable to all the plasma processes carried out at about room temperature (about 23° C. to 27° C.) without using the heater. Further, the intake header is provided in the lower end portion of the processing container 24, and the cooling gas upwardly flows inside the shield cover 72 in which the exhaust header 78 is provided in the embodiments. However, the present invention is not limited thereto. It is also possible to provide the intake header 76 on the upper end portion of the processing container 24, and the exhaust header 78 may be provided in a lower end portion of the processing container 24 to enable the cooling gas to upward flow inside the shield cover 72.

Further, the clean air in the clean room is used as the cooling gas on the supply side in the embodiments. In order to improve controllability, a temperature control device such as a chiller may be provided in a mid-course of the gas supply tube 136 to maintain the temperature of the cooling gas introduced into the space 82 at a constant temperature. The processing container 24 of the upright type which vertically stands is exemplified in the embodiments. However, the present invention is not limited thereto. The present invention may also be applied to a plasma process apparatus of a horizontal type which stays in the horizontal direction.

Further, the semiconductor wafer is used as the object to be processed in the embodiments. The semiconductor wafer includes a compound semiconductor substrate such as a silicon substrate, GaAs, SiC and GaN. Further, the object to be processed is not limited to these substrates, and may be a glass substrate, a ceramic substrate or the like used in a liquid crystal display device.

According to the plasma process apparatus and the plasma process method of the present invention, the following excellent functions are demonstrated.

In the plasma process apparatus, the plural objects to be processed held by the holding unit are accommodated in the cylindrical processing container and a necessary gas is introduced into the processing container, an active species of the gas is generated by the plasma generated by the activating unit, and the objects to be processed undergo a plasma process using the active species. The plasma process apparatus includes the cylindrical shield cover formed to surround the periphery of the processing container to shield the plasma process apparatus from high frequency, and the cooling device which causes the cooling gas to flow through the space between the shield cover and the processing container during the plasma process. The cooling gas is made to flow along the outer side of the processing container with the cooling device to cool the processing container during the plasma process. Therefore, heat generated by the plasma does not accumulate in the space between the shield cover and the processing container. As a result, when the plasma process is carried out at a low temperature range of about room temperature, the process temperature can be maintained low enough to improve reproducibility of the plasma process such as the film forming process.

Further, there includes the thermometry unit for measuring the temperature of the atmosphere in the space, the exhaust tube provided between the exhaust header and the exhaust source, the valve device which is installed in mid-course of the exhaust tube, and closes during the plasma process in a case where the measured temperature obtained by the thermometry unit when the atmosphere in the space is evacuated with the preset volumetric flow rate is lower than the preset threshold temperature. Thus, it is possible to set the condition in which the unnecessary film depositing on the inner wall of the processing container hardly peels off, for example. As a result, the frequency of cleaning may be reduced to improve throughput.

Further, it is possible to set the condition in which the unnecessary film depositing on the inner wall of the processing container hardly peels off, for example. As a result, the frequency of cleaning may be reduced to improve throughput.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present invention have been described in detail, it should be understood that the various changes, substitutions, and alterations could be made hereto without departing from the spirit and scope of the invention.

What is claimed is:

1. A plasma process apparatus that applies a plasma process to an object to be processed, the plasma process apparatus comprising:
a processing container, which is shaped like a cylinder and is configured to be evacuatable to vacuum;
a holding unit configured to hold plural objects to be processed and inserted into and to be extracted from the processing container;
a gas supplying unit configured to supply a gas into the processing container;
an activating unit, which is located along a longitudinal direction of the processing container and is configured to activate the gas by plasma generated by a high frequency power, the activating unit including
a plasma generating box which is subdivided by a plasma compartment wall provided along the longitudinal direction of the processing container,
plasma electrodes provided along the longitudinal direction of the plasma compartment wall, and
a high frequency power source connected to the plasma electrodes;
a cylindrical shield cover configured to surround a periphery of the processing container and to be connected to ground for shielding from high frequency; and
a cooling device that includes an exhaust header including an end plate, the end plate clogging an upper end face of the cylindrical shield cover, including cooling gas flow holes, and being made of metal having a shield function of shielding against high frequency, the cooling device being configured to cause a cooling gas to flow through a space between the cylindrical shield cover and the processing container during the plasma process.

2. The plasma process apparatus according to claim 1, wherein the cooling device includes an intake header configured to be provided on one end of the cylindrical shield cover and to take the cooling gas in, and an exhaust header configured to be provided on another end of the cylindrical shield cover and to be connected to an exhaust source for evacuating an atmosphere in the cylindrical shield cover to the exhaust source.

3. The plasma process apparatus according to claim 2, wherein the exhaust source is a duct of a factory in which the plasma process apparatus is installed.

4. The plasma process apparatus according to claim 2, wherein the exhaust source is an exhaust pump.

5. The plasma process apparatus according to claim 2,
wherein the intake header includes a gas duct formed on a sidewall of the cylindrical shield cover along a peripheral direction of the cylindrical shield cover,
cooling gas flow holes opened in the sidewall of the cylindrical shield cover and provided at preset intervals along the peripheral direction of the cylindrical shield cover, and
a gas intake hole provided in the gas duct through which gas enters the intake header.

6. The plasma process apparatus according to claim 5,
wherein the cooling gas flow holes are provided with punching metal having plural apertures.

7. The plasma process apparatus according to claim 2,
wherein an exhaust box surrounds and covers the cooling gas flow holes, a gas exhaust opening is provided in the exhaust box, and an exhaust tube is connected between the gas exhaust opening and the exhaust source.

8. The plasma process apparatus according to claim 7,
wherein the cooling gas flow holes are provided with punching metal having plural apertures.

9. The plasma process apparatus according to claim 2,
wherein the cooling gas is an atmosphere in a clean room as a factory in which the plasma process apparatus is installed.

10. The plasma process apparatus according to claim 2,
wherein a longitudinal direction of the processing container is vertical.

11. The plasma process apparatus according to claim 10,
wherein the intake header is provided in a lower end portion of the shield cover, and the exhaust header is provided in an upper end portion of the shield cover.

12. The plasma process apparatus according to claim 10,
wherein the intake header is provided in an upper end portion of the shield cover, and the exhaust header is provided in a lower end portion of the shield cover.

13. The plasma process apparatus according to claim 2, further comprising:
a thermometry unit for measuring a temperature of the atmosphere in the space;
an exhaust tube connected between the exhaust header and the exhaust source; and
a valve device which is installed in a mid-course of the exhaust tube, and closes during the plasma process in a case where the measured temperature obtained by the thermometry unit when the plasma process apparatus is in a stand-by state is lower than a preset threshold temperature when the atmosphere in the space is evacuated at a preset volumetric flow rate.

14. The plasma process apparatus according to claim 13,
wherein the valve device includes a flow rate control valve and an on-off valve.

15. The plasma process apparatus according to claim 13, further comprising:
a gas supply tube connected to the intake header; and
an on-off valve provided in a mid-course of the gas supply tube,
wherein
the on-off valve closes during the plasma process in the case where the measured temperature obtained by the thermometry unit is lower than the preset threshold value when the atmosphere in the space is evacuated at the preset volumetric flow rate under the stand-by state.

16. The plasma process apparatus according to claim 13,
wherein the gas includes an aminosilane-based gas as a gas for forming a film.

17. The plasma process apparatus according to claim 13,
wherein the preset threshold value is 33° C.

* * * * *